(12) United States Patent
Kim

(10) Patent No.: US 8,089,072 B2
(45) Date of Patent: Jan. 3, 2012

(54) THIN FILM TRANSISTOR ARRAY PANEL AND MANUFACTURING METHOD THEREOF

(75) Inventor: Dong-Gyu Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/788,163

(22) Filed: May 26, 2010

(65) Prior Publication Data

US 2011/0233551 A1    Sep. 29, 2011

Related U.S. Application Data

(62) Division of application No. 11/192,208, filed on Jul. 27, 2005, now Pat. No. 7,749,824.

(30) Foreign Application Priority Data

Jul. 27, 2004    (KR) .................. 10-2004-0058707

(51) Int. Cl.
*H01L 29/04* (2006.01)
(52) U.S. Cl. ............. 257/72; 257/57; 257/E27.111
(58) Field of Classification Search ............ 257/57, 257/72, E27.111, E29.273; 438/158
See application file for complete search history.

(56) References Cited

U.S. PATENT DOCUMENTS

| | | |
|---|---|---|
| 4,774,207 A | 9/1988 | Possin |
| 5,654,128 A | 8/1997 | Hsu |
| 5,771,083 A | 6/1998 | Fujihara et al. |
| 5,888,892 A | 3/1999 | Yanagida |
| 5,978,058 A | 11/1999 | Sung |
| 6,050,827 A | 4/2000 | Takechi et al. |
| 6,255,130 B1 | 7/2001 | Kim |
| 6,359,320 B1 | 3/2002 | Yamazaki et al. |
| 6,493,048 B1 | 12/2002 | Baek et al. |
| 6,632,115 B1 | 10/2003 | Tsujimura et al. |
| 6,744,486 B2 | 6/2004 | Kim et al. |
| 6,762,802 B2 | 7/2004 | Ono et al. |
| 6,916,691 B1 | 7/2005 | Lai |
| 7,005,331 B2 | 2/2006 | Chen |
| 7,078,279 B2 | 7/2006 | Yoo et al. |
| 7,166,498 B2 | 1/2007 | Yoo et al. |
| 7,279,370 B2 | 10/2007 | Lim et al. |
| 7,518,666 B2 | 4/2009 | Jung et al. |
| 2002/0074549 A1* | 6/2002 | Park et al. ............. 257/59 |
| 2002/0176032 A1 | 11/2002 | Maeda et al. |

(Continued)

FOREIGN PATENT DOCUMENTS

CN    1514468    11/2003

(Continued)

*Primary Examiner* — Matthew W Such
(74) *Attorney, Agent, or Firm* — Innovation Counsel LLP

(57) ABSTRACT

A method of manufacturing a thin film transistor array panel is provided, which includes: forming a gate line on a substrate; forming a gate insulating layer on the gate line; forming a semiconductor layer on the gate insulating layer; forming an ohmic contact on the semiconductor layer; forming a data line and a drain electrode on the ohmic contact; depositing a passivation layer on the data line and the drain electrode; forming a first photoresist layer on the passivation layer; etching the passivation layer and the gate insulating layer using the first photoresist layer as a mask to expose a portion of the drain electrode and a portion of the substrate; depositing a conductive film; and removing the photoresist layer; to form a pixel electrode on a portion of the drain electrode exposed by the etching of the passivation layer.

7 Claims, 33 Drawing Sheets

U.S. PATENT DOCUMENTS

| | | |
|---|---|---|
| 2004/0095544 A1 | 5/2004 | Chang et al. |
| 2004/0106238 A1 | 6/2004 | Lai |
| 2004/0129943 A1 | 7/2004 | Yoo et al. |
| 2004/0197966 A1 | 10/2004 | Cho et al. |

FOREIGN PATENT DOCUMENTS

| | | |
|---|---|---|
| CN | 1606125 | 8/2004 |
| JP | 05-257167 A | 10/1993 |
| JP | 09-236827 A | 9/1997 |
| JP | 11-284195 A | 10/1999 |
| JP | 2000-206571 A | 7/2000 |
| JP | 2002-026333 A | 1/2001 |
| JP | 2001-066639 A | 3/2001 |
| JP | 2001-319876 A | 11/2001 |
| JP | 2002-141512 A | 5/2002 |
| JP | 2002-353465 A | 12/2002 |
| JP | 2004-056153 A | 2/2004 |
| KR | 1020040006179 A | 1/2004 |
| KR | 1020040062013 A | 7/2004 |
| WO | 2004057416 A1 | 7/2004 |

\* cited by examiner

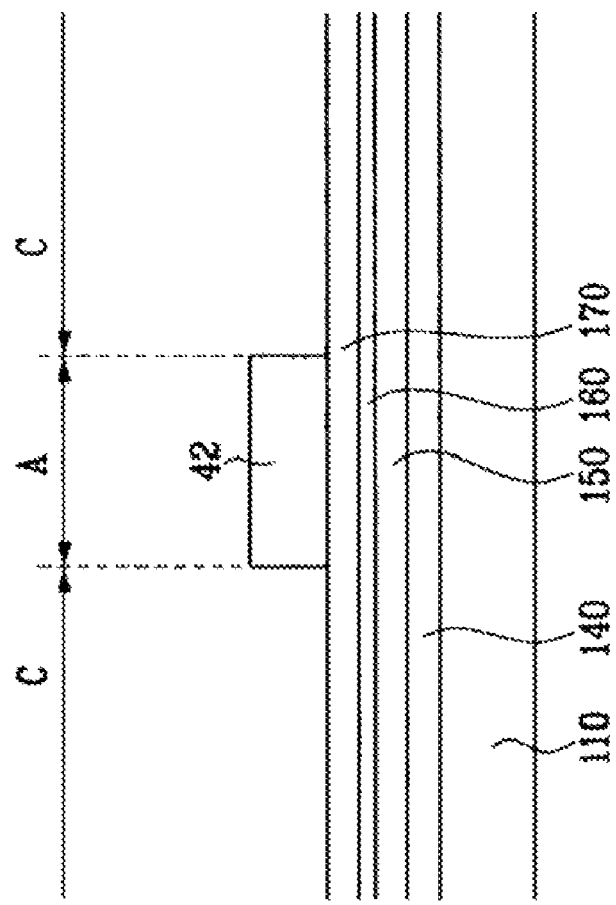

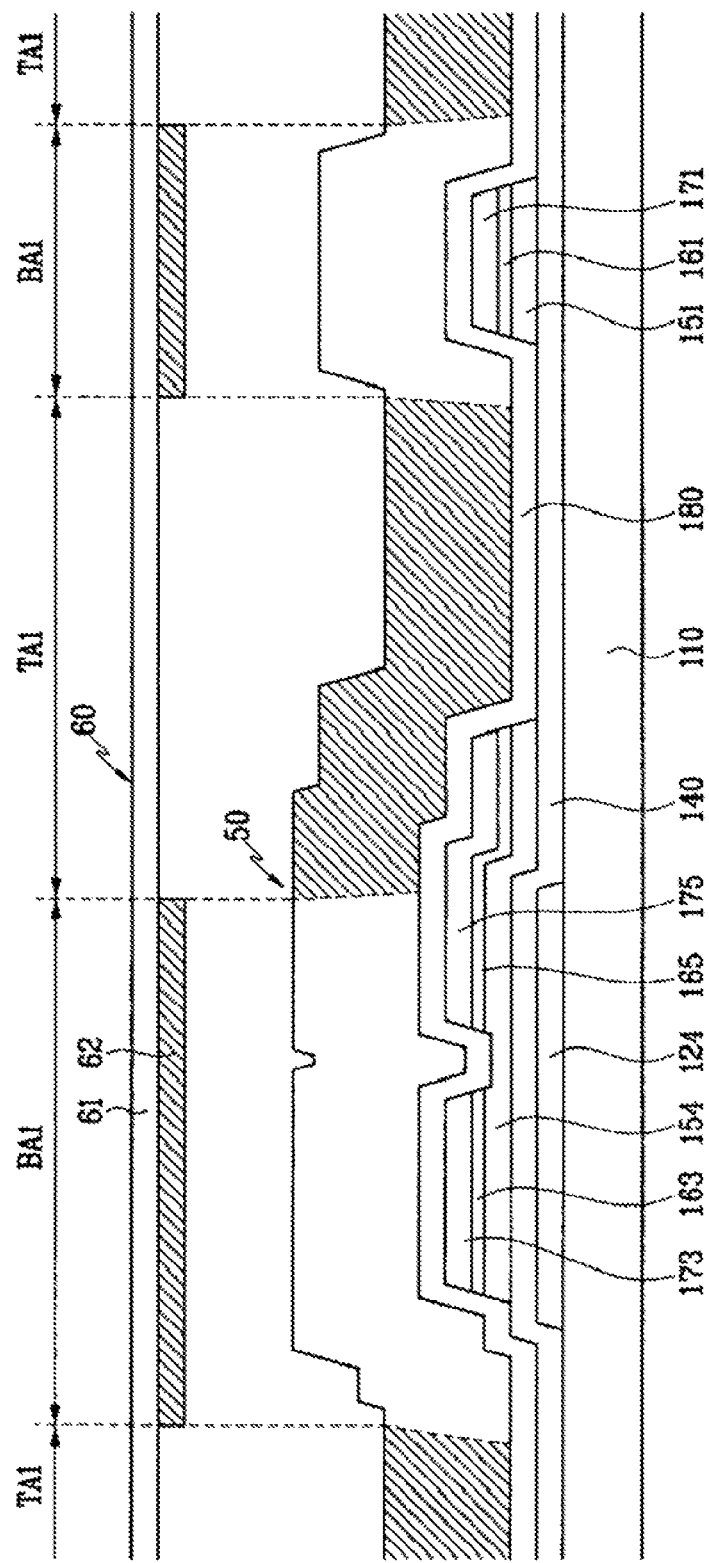

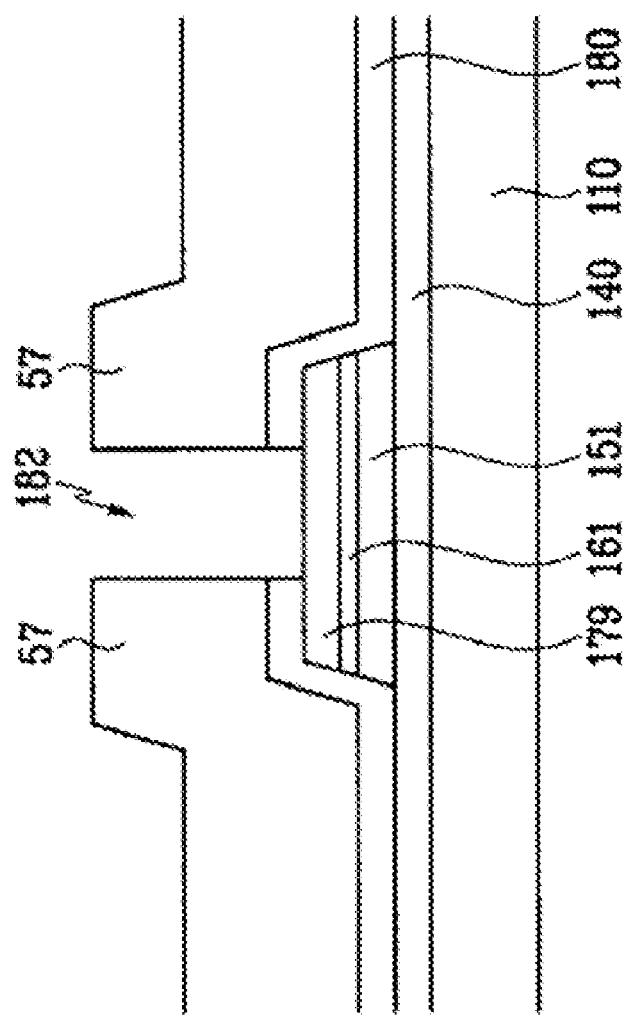

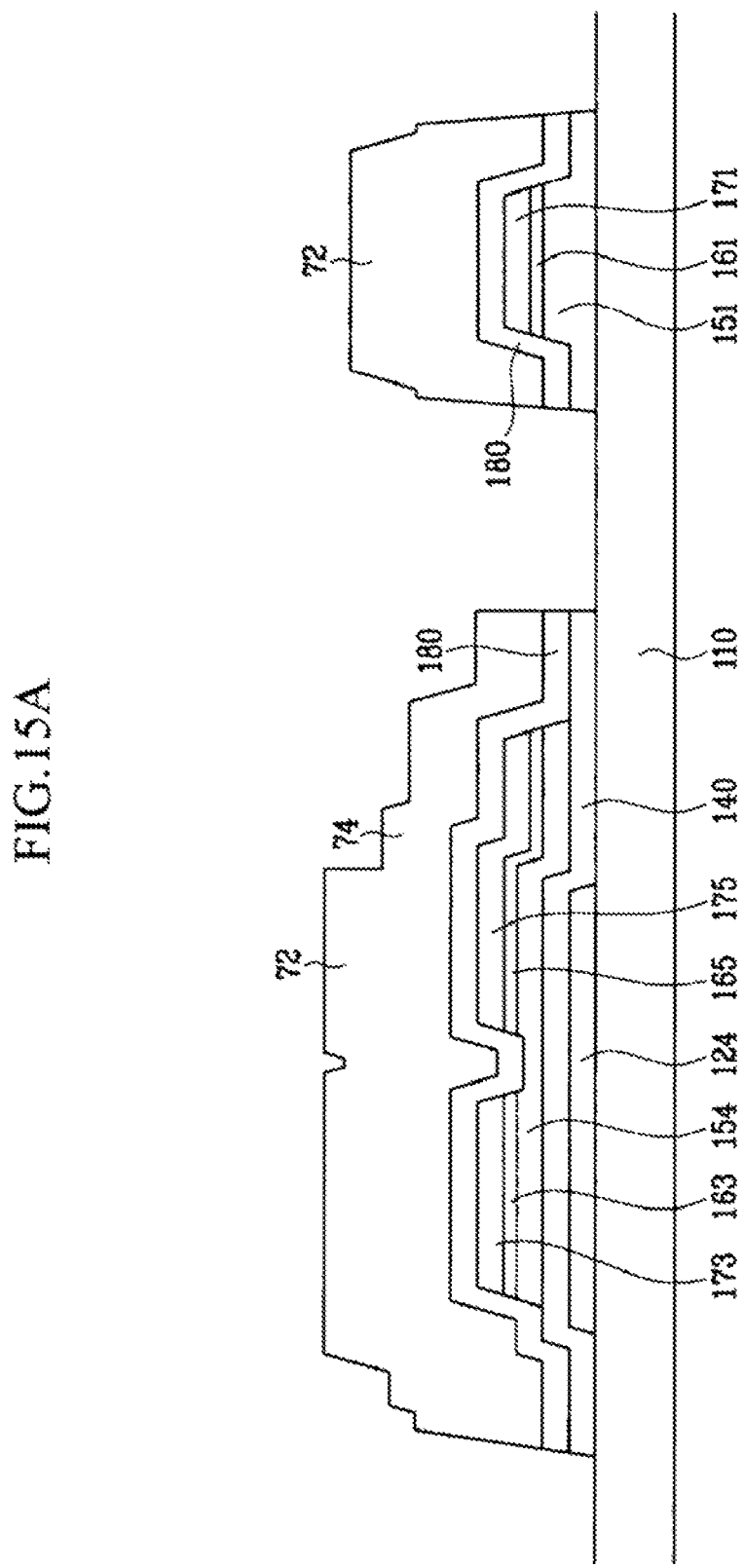

THIN FILM TRANSISTOR ARRAY PANEL AND MANUFACTURING METHOD THEREOF

CROSS-REFERENCE TO RELATED APPLICATIONS

This is a divisional application of U.S. patent application Ser. No. 11/192,208 filed on Jul. 27, 2005, now U.S. Pat. No. 7,749,824 which application claims the benefit of priority, under 35 USC §119, of Korean Patent Application No. 10-2004-0058707, filed on Jul. 27, 2004 in the Korean Intellectual Property Office, the disclosures of both of which are incorporated herein by reference in their entirety and for all purposes.

BACKGROUND (a) Field of the Invention

The present invention relates to a thin film transistor array panel and a manufacturing method thereof.

(b) Description of Related Art

An active type display device, such as a liquid crystal display (LCD) or an organic light emitting diode (OLED) display, includes a plurality of pixels arranged in a matrix, each pixel including field generating electrodes and switching elements. The switching elements include thin film transistors (TFTs) having three terminals, a gate, a source, and a drain. The TFT of each pixel selectively transmits data signals to the field-generating electrode in response to gate signals.

The display device further includes a plurality of signal lines for transmitting signals to the switching elements, which include gate lines transmitting gate signals and data lines transmitting data signals.

The LCD and the OLED include a panel provided with the TFTs, the field-generating electrodes, and the signal lines, which is referred to as a TFT array panel.

The TFT array panel has a layered structure that includes several conductive layers and insulating layers. The gate lines, the data lines, and the field-generating electrodes are formed using various conductive layers separated by insulating layers.

The TFT array panel having the layered structure is manufactured using several lithography steps followed by etching steps. Since lithography requires cost and time, it is desirable to reduce the number of the lithography steps used in manufacturing the TFT array panel.

SUMMARY

A method of manufacturing a thin film transistor array panel is provided, which includes: forming a gate line on a substrate; forming a gate insulating layer on the gate line; forming a semiconductor layer on the gate insulating layer; forming an ohmic contact on the semiconductor layer; forming a data line and a drain electrode on the ohmic contact; depositing a passivation layer on the data line and the drain electrode; forming a first photoresist layer on the passivation layer; etching the passivation layer and the gate insulating layer using the first photoresist layer as a mask to expose a portion of the drain electrode and a portion of the substrate; depositing a conductive film; removing the photoresist layer; to form a pixel electrode on the portion of the drain electrode exposed by the etching of the passivation layer.

The conductive film may include a first portion disposed on the first photoresist layer and a remaining second portion, and the removal of the photoresist layer may remove the first portion of the conductive film by lift off.

The pixel electrode may directly contact the substrate at least in part and the exposed portion of the substrate may enclose the exposed portion of the drain electrode. The exposed portion of the drain electrode and the exposed portion of the substrate may occupy an area defined by the gate line and the data line.

The etching of the passivation layer may expose a portion of the data line, and the method may further include: forming a contact assistant on the exposed portion of the data line.

The formation of the contact assistant may be performed simultaneously with the formation of the pixel electrode.

The formation of the gate insulating layer, the formation of the semiconductor layer, the formation of the ohmic contact, and the formation of the data lines and the drain electrodes may include: sequentially depositing a gate insulating layer, an intrinsic amorphous silicon layer, an extrinsic amorphous silicon layer, and a data conductor layer; forming a second photoresist layer on the data conductor layer; sequentially etching the data conductor layer, the extrinsic amorphous silicon layer, and the intrinsic amorphous silicon layer using the second photoresist layer as a mask to form a data conductor, an extrinsic semiconductor layer, and an intrinsic semiconductor layer; transforming the second photoresist layer into a third photoresist layer; and etching the data conductor and the extrinsic semiconductor layer to form the data line and the drain electrode and ohmic contacts.

The second photoresist layer may be formed by using a photo mask including a light blocking area, a translucent area, and a light transmitting area.

The partial removal of the second photoresist layer to form the third photoresist layer may include ashing.

The formation of the gate insulating layer, the formation of the semiconductor layer, the formation of the ohmic contact, the formation of the data lines, and the formation of the drain electrodes may be performed using a single lithography step.

The data line and the drain electrode may include Mo or Cr and the pixel electrode may include amorphous ITO or IZO.

A method of manufacturing a thin film transistor array panel is provided, which includes: forming a gate line on a substrate; forming a gate insulating layer on the gate line; forming a semiconductor layer on the gate insulating layer; forming an ohmic contact on the semiconductor layer; forming a data line and a drain electrode on the ohmic contact; depositing a passivation layer on the data line and the drain electrode; forming a first photoresist layer; etching the passivation layer and the gate insulating layer using the first photoresist layer as a mask to expose a portion of the substrate; partially removing the first photoresist layer to form a second photoresist layer; etching the passivation layer using the second photoresist layer as a mask to expose a portion of the drain electrode; depositing a conductive film; and removing the second photoresist layer to form a pixel electrode on the portion of the drain electrode exposed by the etching of the passivation layer.

The first photoresist layer may be formed by using a photo mask including a light blocking area, a translucent area, and a light transmitting area.

The partial removal of the first photoresist layer to form the second photoresist layer may comprise ashing.

The semiconductor layer, the ohmic contact, the data line, and the drain electrode may be formed using a single lithography step.

The conductive film may include a first portion disposed on the second photoresist layer and a remaining second portion, and the removal of the second photoresist layer may remove the first portion of the conductive film by lift off.

The pixel electrode may directly contact the substrate and the gate insulating layer at least in part.

The etching of the passivation layer using the second photoresist layer as a mask may expose a portion of the gate insulating layer, and an area defined by the gate line and the data line may be substantially occupied by the exposed portion of the substrate except for the exposed portion of the drain electrode and the exposed portion of the gate insulating layer.

The etching of the passivation layer using the second photoresist layer may expose a portion of the data line, and the removal of the second photoresist layer may include: forming a contact assistant on the exposed portion of the data line.

The formation of the gate insulating layer, the formation of the semiconductor layer, the formation of the ohmic contact, and the formation of the data lines and the drain electrodes may include: sequentially depositing a gate insulating layer, an intrinsic amorphous silicon layer, an extrinsic amorphous silicon layer, and a data conductor layer; forming a third photoresist layer on the data conductor layer; sequentially etching the data conductor layer, the extrinsic amorphous silicon layer, and the intrinsic amorphous silicon layer using the third photoresist layer as a mask to form a data conductor, an extrinsic semiconductor layer, and an intrinsic semiconductor layer; transforming the third photoresist layer into a fourth photoresist layer; and etching the data conductor and the extrinsic semiconductor layer to form the data line, the drain electrode, and ohmic contacts.

The third photoresist layer may be formed by using a photo mask including a light blocking area, a translucent area, and a light transmitting area.

The partial removal of the third photoresist layer to form the fourth photoresist layer may comprise ashing.

A thin film transistor array panel is provided, which includes: a gate line formed on a substrate; a gate insulating layer formed on the gate line; a semiconductor layer formed on the gate insulating layer; a data line and a drain electrode formed on the semiconductor layer at least in part, the drain electrode including first and second portions; a passivation layer formed on the data line and the first portion of the drain electrode; and a pixel electrode formed on the substrate and the second portion of the drain electrode, said pixel electrode having edges substantially coinciding with edges of the passivation layer.

The passivation layer may have a contact hole exposing a portion of the data line, and the thin film transistor array panel may further include a contact assistant formed in the contact hole and having edges substantially coinciding with edges of the contact hole.

The gate insulating layer may have edges substantially coinciding with edges of the passivation layer except for a portion under the drain electrode.

The gate insulating layer may have edges substantially coinciding with edges of the passivation layer except for a portion around the drain electrode and the portion around the drain electrode may be exposed.

The exposed portion of the gate insulating layer may be covered with the pixel electrode.

The semiconductor layer may have substantially the same planar shape as the data line and the drain electrode except for a portion disposed between the data line and the drain electrode.

The pixel electrode may include a cutout.

The thin film transistor array panel may further include a storage electrode comprised of the same layer as the gate line and overlapping the pixel electrode and a storage conductor formed on the gate insulating layer, connected to the pixel electrode, and overlapping the storage electrode.

BRIEF DESCRIPTION OF THE DRAWINGS

The present invention will become more apparent by describing embodiments thereof in detail with reference to the accompanying drawing in which:

FIGS. 5A and 5B illustrate the step following the step shown in FIGS. 4A and 4B, where FIG. 5A is a sectional view of the TFT array panel shown in FIG. 3 taken along the line IVA-IVA' and FIG. 5B is a sectional view of the TFT array panel shown in FIG. 3 taken along the lines IVB-IVB';

FIGS. 8A and 8B illustrate the step following the step shown in FIGS. 7A and 7B, where FIG. 8A is a sectional view of the TFT array panel shown in FIG. 6 taken along the line VIIA-VIIA' and FIG. 8B is a sectional view of the TFT array panel shown in FIG. 6 taken along the lines VIIB-VIIB';

FIG. 10B is a sectional view of the TFT array panel shown in FIG. 9 taken along the lines XB-XB';

FIG. 11A is a sectional view of the TFT array panel shown in FIG. 9 taken along the line XA-XA' and FIG. 11B is a sectional view of the TFT array panel shown in FIG. 9 taken along the lines XB-XB';

FIGS. 15A and 15B are sectional views of the TFT array panel shown in FIGS. 12-13B taken along the lines XIIIA-XIIIA' and XIIIB-XIIIB', which illustrate the step following the step shown in FIGS. 14A and 14B;

DETAILED DESCRIPTION

Figure 1:
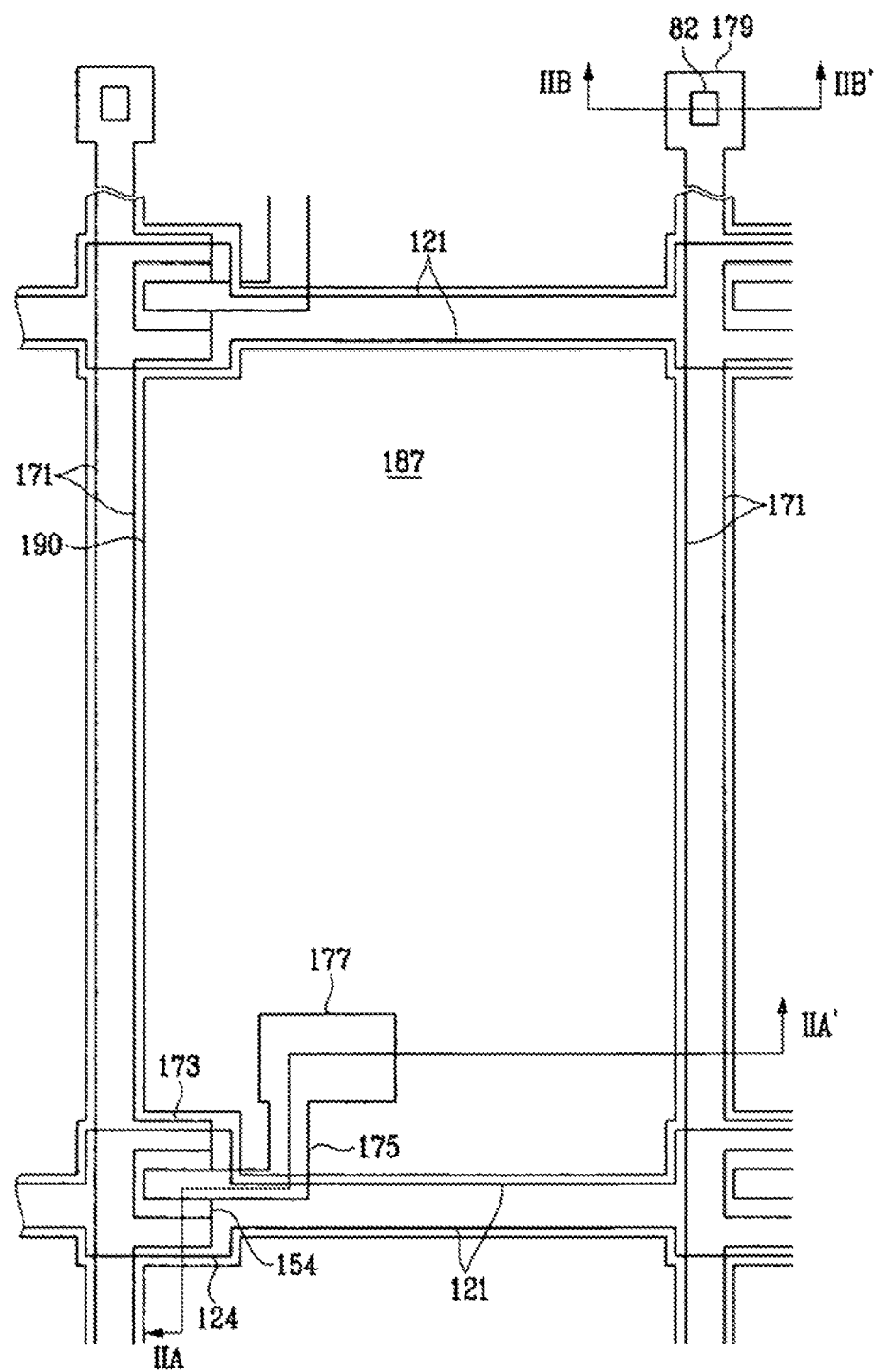
FIG. 1 is a layout view of a TFT array panel according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, region or substrate is referred to as being "on" another element, the element can be directly on the other element or intervening elements may also be present. In contrast, when an element is referred to as being "directly on" another element, there are no intervening elements present.

A TFT array panel according to an embodiment of the present invention will be described in detail with reference to FIGS. 1, 2A and 2B.

Figure 2A:
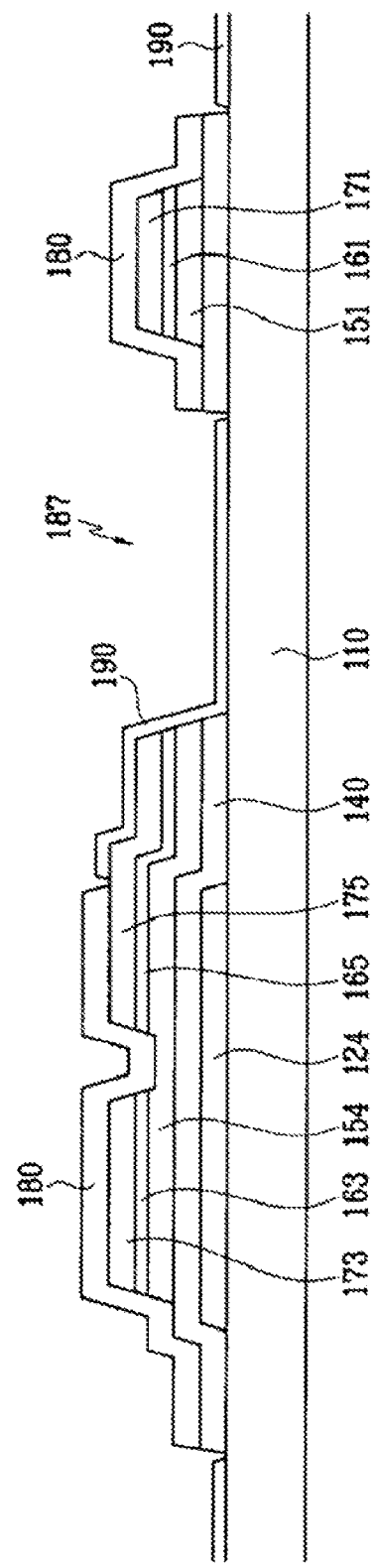
FIG. 2A is a sectional view of the TFT array panel shown in FIG. 1 taken along the line IIA-IIA'.
Figure 2B:
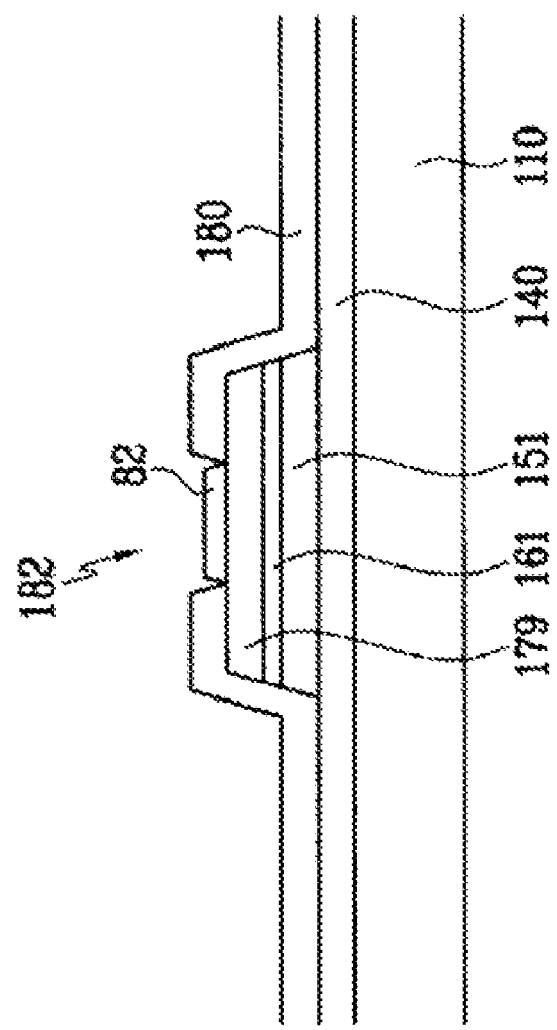
FIG. 2B is a sectional view of the TFT array panel shown in FIG. 1 taken along the line IIB-IIB'.

FIG. 1 is a layout view of a TFT array panel according to an embodiment of the present invention, FIG. 2A is a sectional view of the TFT array panel shown in FIG. 1 taken along the line IIA-IIA', and FIG. 2B is a sectional view of the TFT array panel shown in FIG. 1 taken along the lines IIB-IIB'.

A plurality of gate lines 121 are formed on an insulating substrate 110 such as transparent glass or plastic. The gate lines 121 transmit gate signals and extend substantially in a transverse direction. Each gate line 121 includes a plurality of gate electrodes 124 projecting upward and downward, as shown in FIG. 1. Each gate line 121 may further include an end portion (not shown) having a large area for contact with another layer or an external driving circuit. A gate driving circuit (not shown) for generating the gate signals may be mounted on a flexible printed circuit (FPC) film, which may be attached to the substrate 110, directly mounted on the substrate 110, or integrated onto the substrate 110. The gate lines 121 may extend to be connected to a driving circuit that may be integrated on the substrate 110.

The gate lines 121 may comprise, e.g., a metal comprising Al, such as Al and Al alloy, a metal comprising Ag, such as Ag and Ag alloy, a metal comprising Cu, such as Cu and Cu alloy, a metal comprising Mo, such as Mo and Mo alloy, Cr, Ti or Ta. The gate lines 121 may have a multi-layered structure including two conductive films (not shown) having different physical characteristics. One of the two films preferably comprises a low resistivity metal including a metal comprising Al, a metal comprising Ag, or a metal comprising Cu for reducing signal delay or voltage drop. The other film preferably comprises a material such as a metal comprising Mo, Cr, Ta, or Ti, which have good physical, chemical, and electrical contact characteristics with other materials, such as indium tin oxide (ITO) or indium zinc oxide (IZO). Good examples of the combination of the two films are a lower Cr film and an upper Al (alloy) film and a lower Al (alloy) film and an upper Mo (alloy) film. However, the gate lines 121 may comprise various metals or conductors.

The lateral sides of the gate lines 121 are inclined relative to a surface of the substrate 110, and the inclination angle of the sides may range from about 30 to about 80 degrees.

A gate insulating layer 140 comprising silicon nitride (SiNx) is formed on the gate lines 121.

A plurality of semiconductor stripes 151 comprising hydrogenated amorphous silicon (abbreviated to "a-Si") or polysilicon are formed on the gate insulating layer 140. Each semiconductor stripe 151 extends substantially in the longitudinal direction and has a plurality of projections 154 branching out toward the gate electrodes 124.

A plurality of ohmic contact stripes and islands 161 and 165 are formed on the semiconductor stripes 151. The ohmic contact stripes and islands 161 and 165 may comprise n+ hydrogenated a-Si heavily doped with an n type impurity, such as phosphorous, or the ohmic contact stripes and islands 161 and 165 may comprise silicide. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate 110, and the inclination angles of the lateral sides may range from about 30 to about 80 degrees.

A plurality of data lines 171 and a plurality of drain electrodes 175 separated from the data lines 171 are formed on the ohmic contacts 161 and 165.

The data lines 171 transmit data signals and extend substantially in the longitudinal direction to intersect the gate lines 121. Each data line 171 includes a plurality of source electrodes 173 projecting toward the gate electrodes 124 and an end portion 179 having a large area for contact with another layer or an external driving circuit. A data driving circuit (not shown) for generating the data signals may be mounted on a flexible printed circuit (FPC) film, which may be attached to the substrate 110, directly mounted on the substrate 110, or integrated onto the substrate 110. The data lines 171 may extend to be connected to a driving circuit that may be integrated on the substrate 110.

The drain electrodes 175 are separated from the data lines 171 and disposed opposite the source electrodes 173 with respect to the gate electrodes 124. Each drain electrode 175 includes a wide end portion 177 and a narrow end portion. The source electrode 173 includes a recessed portion that partially encloses the narrow end portion of the drain electrode 175.

A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The data lines 171 and the drain electrodes 175 may comprise a refractory metal, such as Cr, Mo, Ti, Ta, or alloys thereof. The data lines 171 and the drain electrodes 175 may also have a multilayered structure comprising a refractory metal film (not shown) and a low resistivity film (not shown). Good examples of a multi-layered structure are a double-layered structure including a lower Cr/Mo (alloy) film and an upper Al (alloy) film and a triple-layered structure of a lower Mo (alloy) film, an intermediate Al (alloy) film, and an upper Mo (alloy) film. However, the data lines 171 and the drain electrodes 175 may comprise various metals or conductors.

The data lines 171 and the drain electrodes 175 have inclined edge profiles relative to a surface of the substrate 110, and the inclination angles of the edge profiles may range from about 30 to about 80 degrees.

The ohmic contacts 161 and 165 are interposed only between the underlying semiconductor stripes 151 and the overlying conductors 171 and 175 thereon and reduce the contact resistance therebetween. The semiconductor stripes 151 have almost the same planar shapes as the data lines 171 and the drain electrodes 175 as well as the underlying ohmic contacts 161 and 165. However, the projections 154 of the semiconductor stripes 151 include some exposed portions, which are not covered with the data lines 171 and the drain electrodes 175. These exposed portions of the projections 154 include portions located between the source electrodes 173 and the drain electrodes 175.

A passivation layer 180 is formed on the data lines 171, the drain electrodes 175, and the exposed portions of the semiconductor stripes 151. The passivation layer 180 may comprise an inorganic insulator such as silicon nitride or silicon oxide. Alternatively, the passivation layer 180 may comprise an organic insulator or low dielectric insulator. The organic insulator and the low dielectric insulator preferably have a dielectric constant less than about 4.0. The low dielectric insulator may comprise a-Si:C:O and a-Si:O:F formed by plasma enhanced chemical vapor deposition (PECVD). The organic insulator for the passivation 180 may have photosensitivity and the passivation layer 180 may have a flat surface. The passivation layer 180 may comprise a lower film of an inorganic insulator and an upper film of an organic insulator to obtain the desirable insulating characteristics of the organic insulator while preventing the exposed portions of the semiconductor stripes 151 from being damaged by the organic insulator.

The passivation layer 180 has a plurality of contact holes 182 exposing the end portions 179 of the data lines 171 and a plurality of openings 187 in areas enclosed by the gate lines 121 and the data lines 171. The openings 187 expose the wide end portions 177 of the drain electrodes 175. Portions of the gate insulating layer 140 in the openings 187, which are not covered by the drain electrodes 175, are also removed to expose the substrate 110. Accordingly, the gate insulating layer 140 may have substantially the same planar shape as the passivation layer 180 except for portions disposed under the data lines 171 and the drain electrodes 175.

A plurality of pixel electrodes 190 are formed in the openings 187 on the passivation layer 180, and a plurality of contact assistants 82 are formed in the contact holes 182. The pixel electrodes 190 and contact assistants 82 may comprise a transparent conductor such as (amorphous) ITO or IZO or a reflective conductor such as Ag, Al, or alloys thereof. The boundaries of the pixel electrodes 190 and the contact assistants 82 coincide with those of the passivation layer 180.

The pixel electrodes 190 are physically and electrically connected to the drain electrodes 175 such that the pixel electrodes 190 receive data voltages from the drain electrodes 175. The pixel electrodes 190 supplied with the data voltages generate electric fields in cooperation with a common electrode (not shown) of an opposing display panel (not shown) supplied with a common voltage, which determine the orientations of liquid crystal molecules (not shown) of a liquid crystal layer (not shown) disposed between the pixel electrode and the common electrode on the opposing display panel. A pixel electrode 190 and the common electrode form a capacitor referred to as a "liquid crystal capacitor," which stores applied voltages after the TFT turns off.

The contact assistants 82 are connected to the end portions 179 of the data lines 171 through the contact holes 182. The contact assistants 82 protect the end portions 179 and enhance the adhesion between the end portions 179 and external devices.

When the gate lines 121 are connected to another layer or external devices as described above, a plurality of contact holes (not shown) and a plurality of contact assistants (not shown) in the contact holes may be provided.

Now, a method of manufacturing the TFT array panel shown in FIGS. 1-2B according to an embodiment of the present invention will be described in detail with reference to FIGS. 3-11B as well as FIGS. 1-2B.

Figure 3:
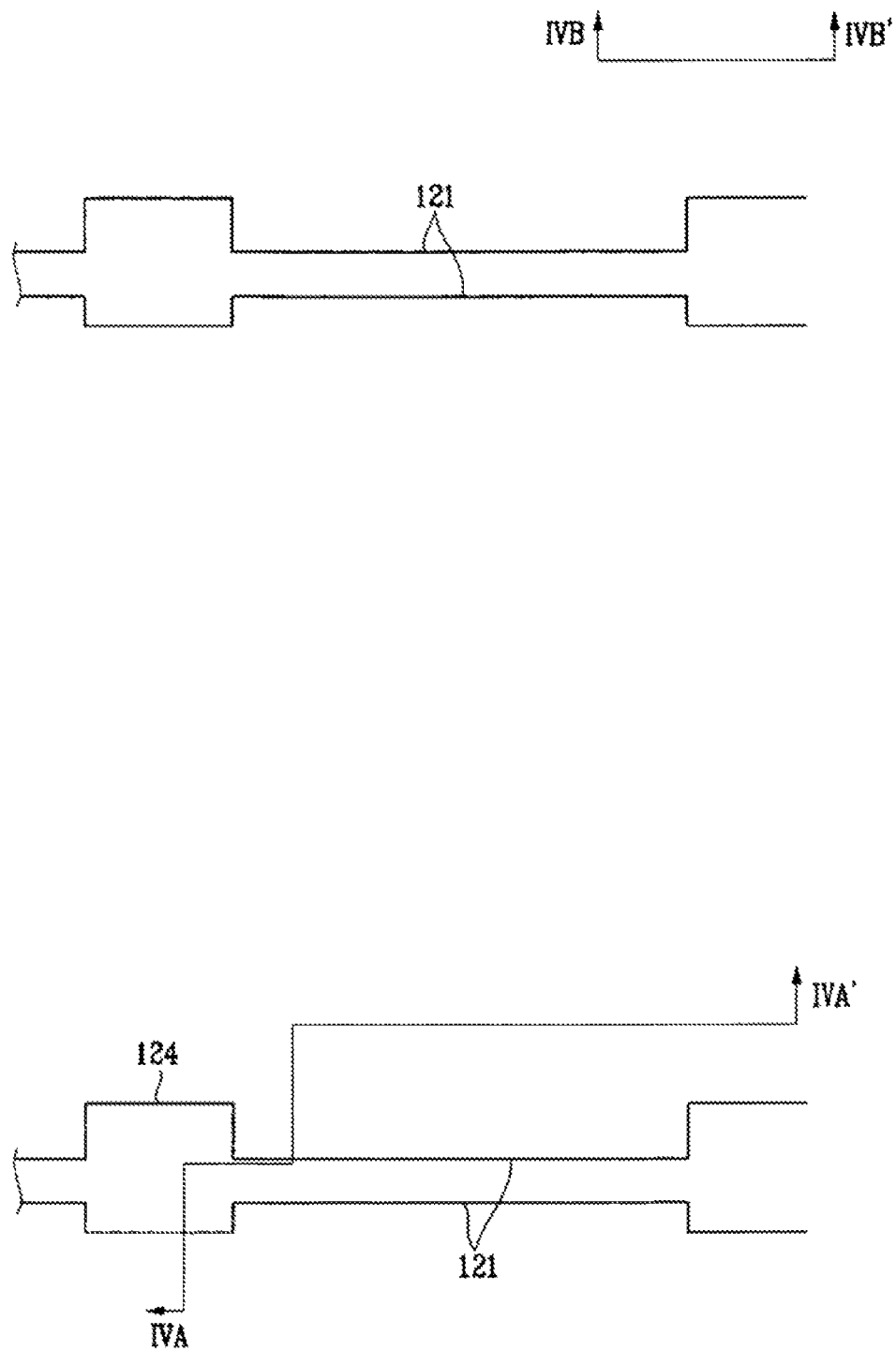
FIGS. 3, 6 and 9 are layout views of a TFT array panel shown in FIGS. 1-2B in intermediate steps of a manufacturing method thereof according to an embodiment of the present invention.
Figure 4A:
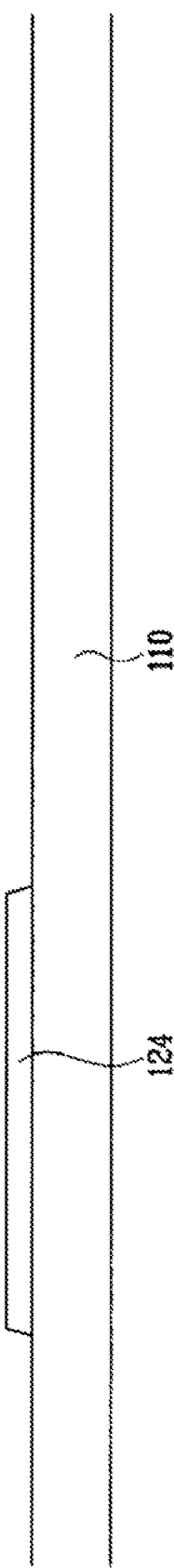
FIG. 4A is a sectional view of the TFT array panel shown in FIG. 3 taken along the line IVA-IVA'.
Figure 4B:
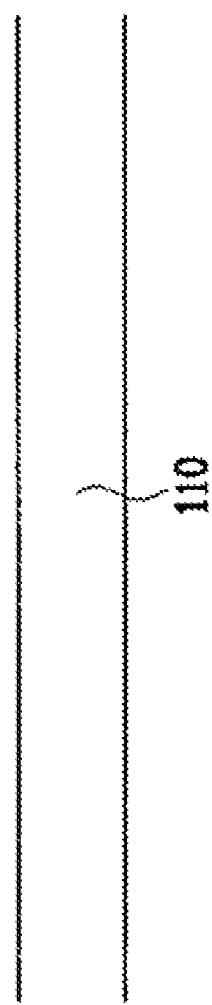
FIG. 4B is a sectional view of the TFT array panel shown in FIG. 3 taken along the lines IVB-IVB'.
Figure 5A:
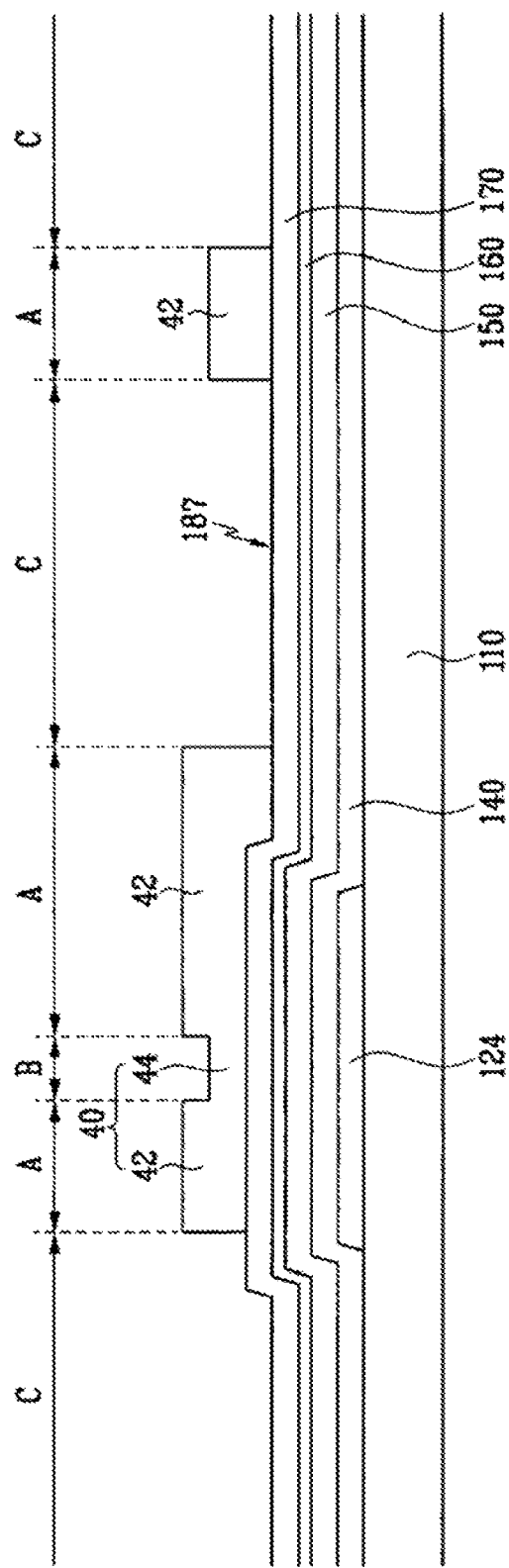
Figure 6:
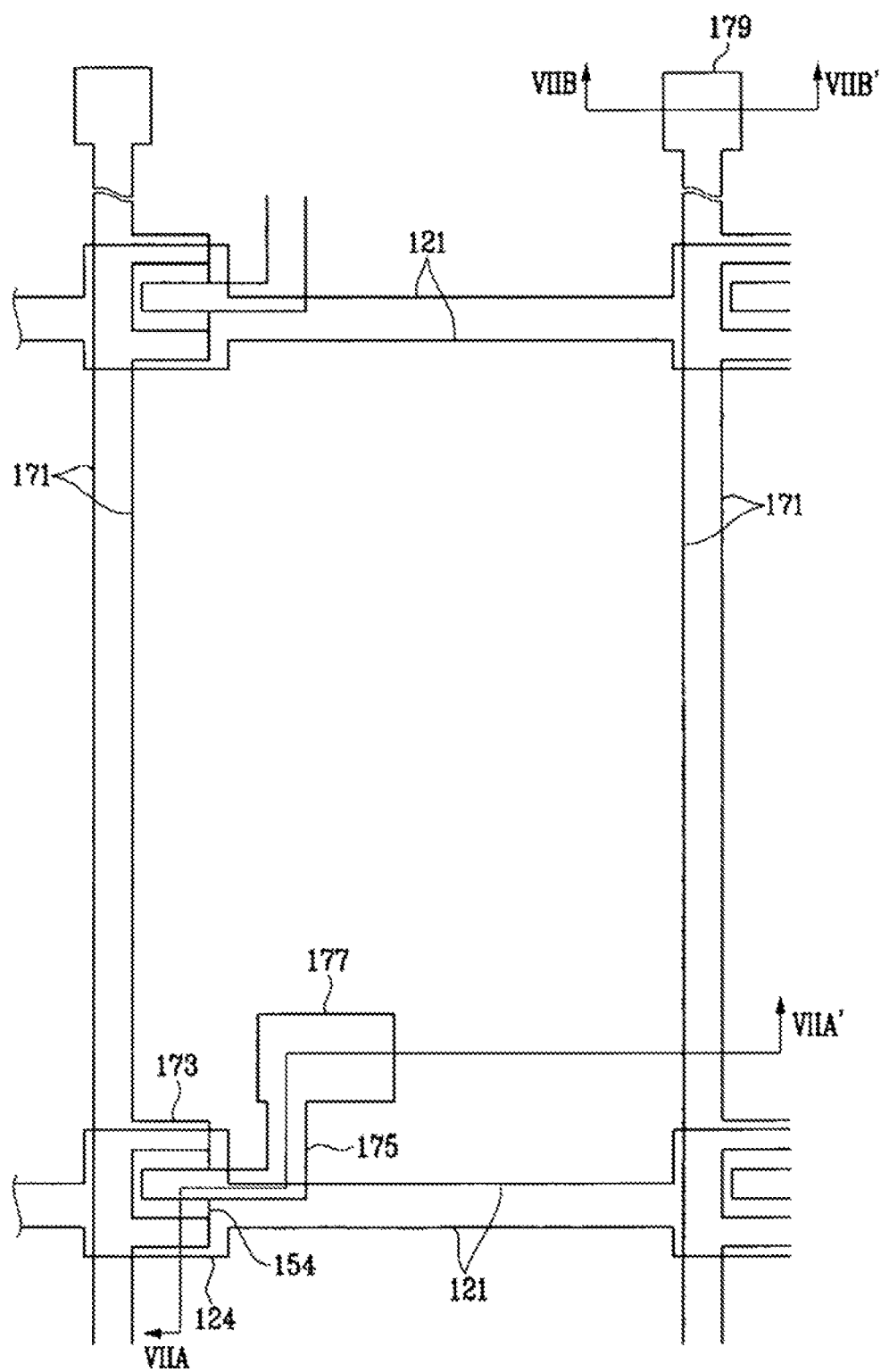
Figure 7A:
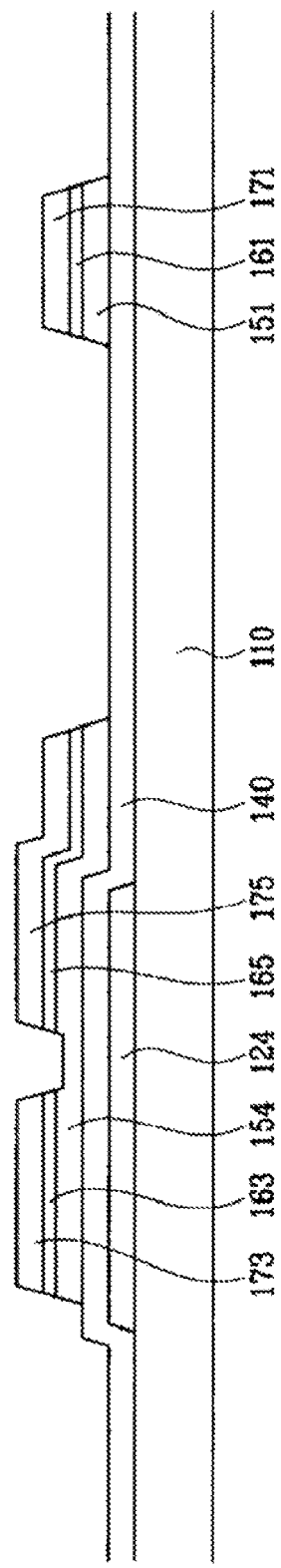
FIG. 7A is a sectional view of the TFT array panel shown in FIG. 6 taken along the line VIIA-VIIA'.
Figure 7B:
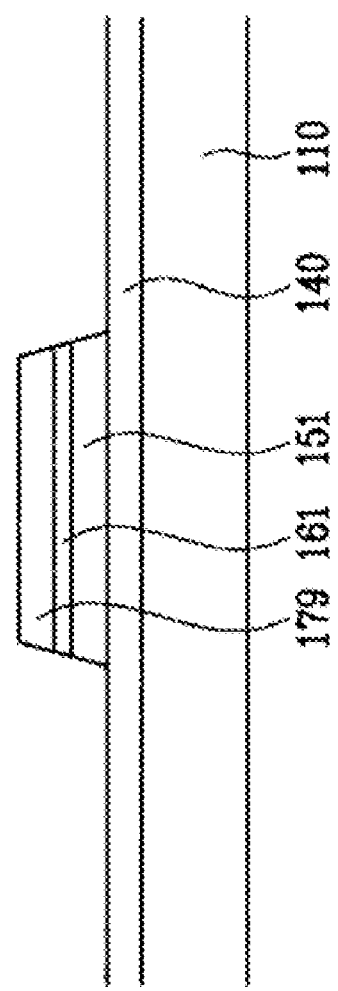
FIG. 7B is a sectional view of the TFT array panel shown in FIG. 6 taken along the lines VIIB-VIIB'.
Figure 8B:
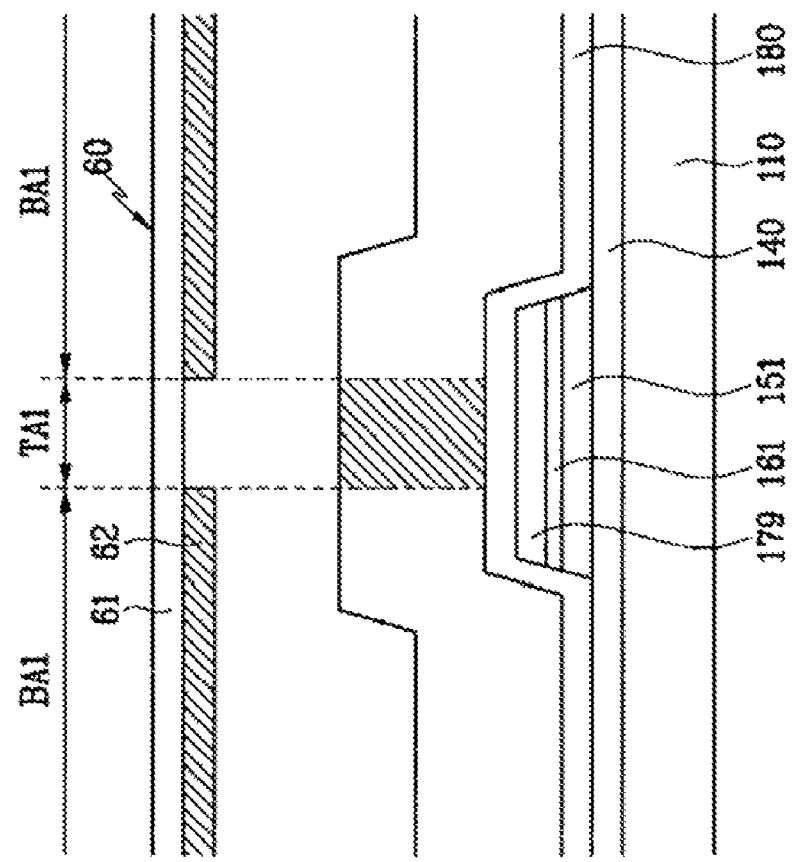
Figure 9:
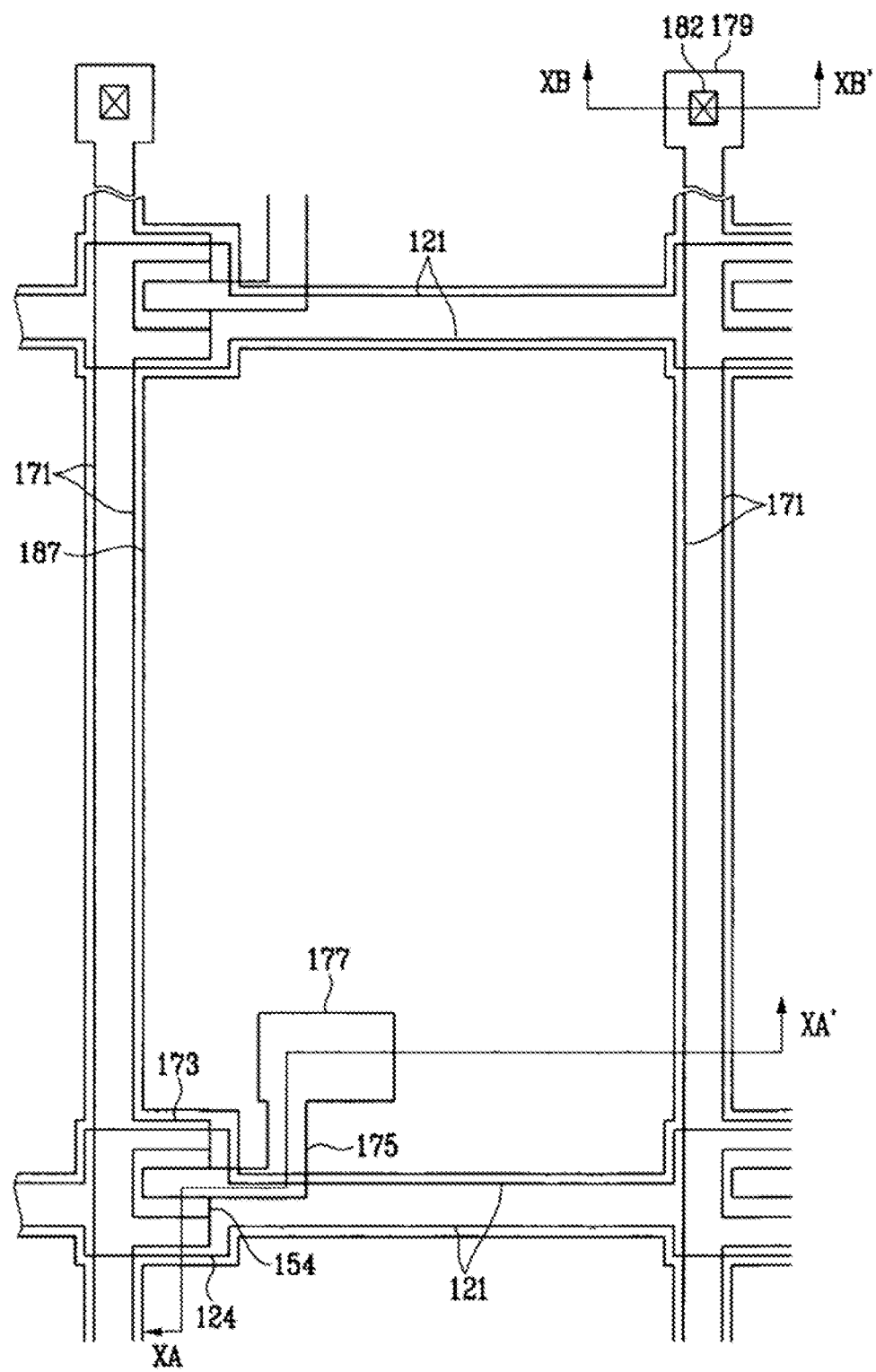
Figure 10A:
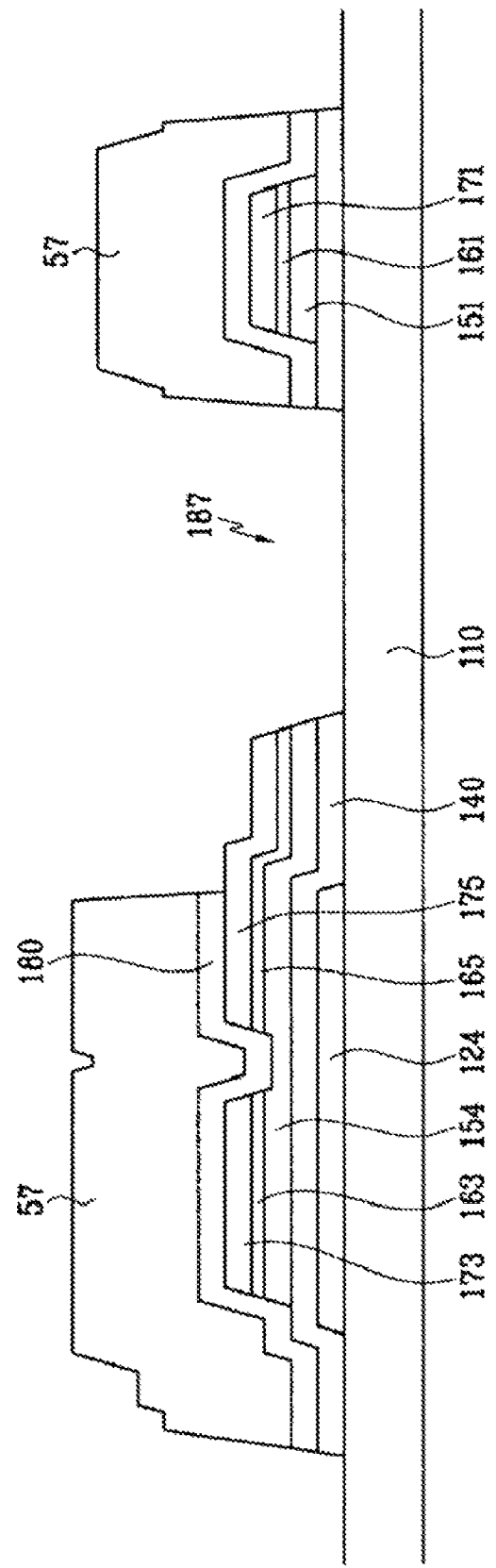
FIG. 10A is a sectional view of the TFT array panel shown in FIG. 9 taken along the line XA-XA'.
Figure 11A:
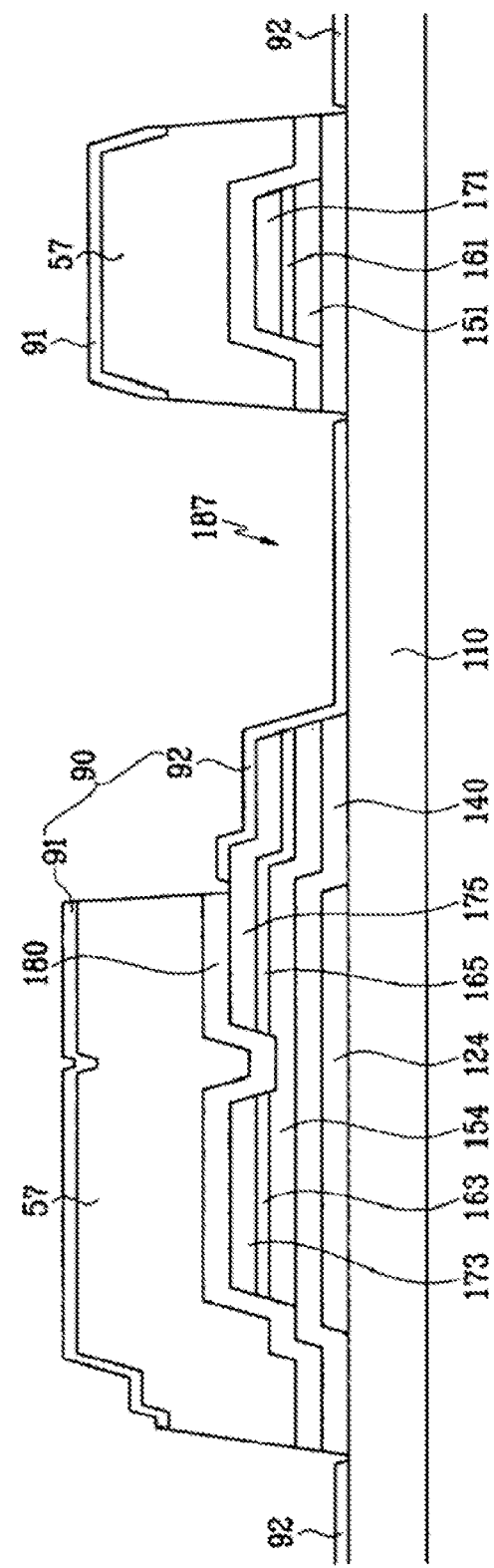
FIGS. 11A and 11B illustrate the step following the step shown in FIGS. 10A and 10B, where
Figure 11B:
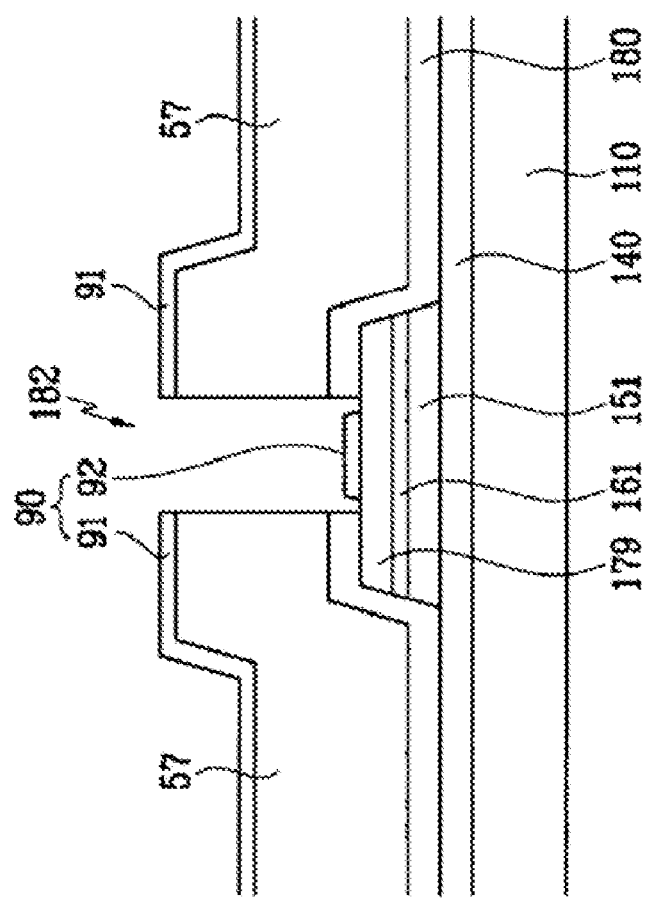

FIGS. 3, 6 and 9 are layout views of a TFT array panel shown in FIGS. 1-2B in intermediate steps of a manufacturing method thereof according to an embodiment of the present invention. FIG. 4A is a sectional view of the TFT array panel shown in FIG. 3 taken along the line IVA-IVA' and FIG. 4B is a sectional view of the TFT array panel shown in FIG. 3 taken along the lines IVB-IVB'. FIGS. 5A and 5B illustrate the step following the step shown in FIGS. 4A and 4B, where FIG. 5A is a sectional view of the TFT array panel shown in FIG. 3 taken along the line IVA-IVA' and FIG. 5B is a sectional view of the TFT array panel shown in FIG. 3 taken along the lines IVB-IVB'. FIG. 7A is a sectional view of the TFT array panel shown in FIG. 6 taken along the line VIIA-VIIA' and FIG. 7B is a sectional view of the TFT array panel shown in FIG. 6 taken along the lines VIIB-VIIB'. FIGS. 8A and 8B illustrate the step following the step shown in FIGS. 7A and 7B, where FIG. 8A is a sectional view of the TFT array panel shown in FIG. 6 taken along the line VIIA-VIIA' and FIG. 8B is a sectional view of the TFT array panel shown in FIG. 6 taken along the lines VIIB-VIIB'. FIG. 10A is a sectional view of the TFT array panel shown in FIG. 9 taken along the line XA-XA' and FIG. 10B is a sectional view of the TFT array panel shown in FIG. 9 taken along the lines XB-XB'. FIGS. 11A and 11B illustrate the step following the step shown in FIGS. 10A and 10B, where FIG. 11A is a sectional view of the TFT array panel shown in FIG. 9 taken along the line XA-XA' and FIG. 11B is a sectional view of the TFT array panel shown in FIG. 9 taken along the lines XB-XB'.

Referring to FIGS. 3, 4A and 4B, a conductive layer preferably comprising metal is deposited on an insulating substrate 110 preferably comprising transparent glass by, e.g., sputtering. The conductive layer may have a thickness of about 1,000-3,000 .ANG. The conductive layer is then subjected to lithography and etching to form a plurality of gate lines 121 including gate electrodes 124.

Referring to FIGS. 5A and 5B, a gate insulating layer 140, an intrinsic a-Si layer 150, and an extrinsic a-Si layer 160 are sequentially deposited using, e.g., CVD, etc. The gate insulating layer 140 may comprise silicon nitride having a thickness of about 2,000-5,000 .ANG. The deposition temperature of the gate insulating layer 140 is preferably in a range of about 250-450.degree. C.

A conductive layer 170 comprising metal is then deposited using, e.g., sputtering, and a photoresist layer 40 with a thickness of about 1-2 microns is coated on the conductive layer 170.

The photoresist layer 40 is exposed to light through a photo mask (not shown), and developed such that the developed photoresist has a position dependent thickness. The photoresist shown in FIGS. 5A and 5B includes a plurality of first to third portions in order of decreasing thickness. The first portions 42 are located on wire areas A and the second portions 44 are located on channel areas B. Third portions (not numbered) are located on remaining areas C and have substantially zero thickness, thereby exposing underlying portions of the conductive layer 170. The thickness ratio of the second portions 44 to the first portions 42 is adjusted depending upon the process conditions in the subsequent process steps. It may be preferable that the thickness of the second portions 44 is equal to or less than half of the thickness of the first portions 42, and in particular, equal to or less than 4,000 .ANG.

The position-dependent thickness of the photoresist may be obtained using one of several techniques, for example, by providing translucent areas on the exposure mask as well as light transmitting areas and light blocking opaque areas. The translucent areas may have a slit pattern, a lattice pattern, a thin film(s) with intermediate transmittance, or intermediate thickness. When using a slit pattern, it may be preferable that the width of the slits or the distance between the slits is smaller than the resolution of a light exposure used for the photolithography. Another example is to use reflowable photoresist. In detail, once a photoresist pattern comprising a reflowable material is formed by using a normal exposure mask having only transparent areas and opaque areas, the photoresist layer 40 is subjected to a reflow process to flow onto areas without the photoresist, thereby forming thin portions.

The different thickness of the first portions 42 and second portions 44 of the photoresist layer 40 enables the selective etching of underlying layers when using suitable process conditions. Therefore, a plurality of data lines 171 including source electrodes 173 and end portions 179, a plurality of drain electrodes 175 including wide end portions 177, a plurality of ohmic contact stripes 161 including projections 163, a plurality of ohmic contact islands 165, and a plurality of semiconductor stripes 151 including projections 154 may be obtained as shown in FIGS. 6, 7A and 7B by a series of etching steps.

For descriptive purpose, portions of the conductive layer 170, the extrinsic a-Si layer 160, and the intrinsic a-Si layer 150 on the wire areas A are referred to as first portions, portions of the conductive layer 170, the extrinsic a-Si layer 160, and the intrinsic a-Si layer 150 on the channel areas B are referred to as second portions, and portions of the conductive layer 170, the extrinsic a-Si layer 160, and the intrinsic a-Si layer 150 on the remaining areas C are referred to as third portions.

An exemplary sequence of forming such a structure is as follows:

(1) Removal of third portions of the conductive layer 170, the extrinsic a-Si layer 160 and the intrinsic a-Si layer 150 on the remaining areas C;

(2) Removal of the second portions 44 of the photoresist;

(3) Removal of the second portions of the conductive layer 170 and the extrinsic a-Si layer 160 on the channel areas B; and (4) Removal of the first portions 42 of the photoresist.

Another exemplary sequence is as follows:

(1) Removal of the third portions of the conductive layer 170;

(2) Removal of the second portions 44 of the photoresist;

(3) Removal of the third portions of the extrinsic a-Si layer 160 and the intrinsic a-Si layer 150;

(4) Removal of the second portions of the conductive layer 170;

(5) Removal of the first portions 42 of the photoresist; and (6) Removal of the second portions of the extrinsic a-Si layer 160.

Because the first portions 42 of the photoresist layer 40 are thicker than the second portions 44, even when the second portions 44 of the photoresist are removed, portions of the first portions 42 will remain. The remaining first portions 42 will have a reduced thickness, but will still prevent underlying layers from being removed or etched.

The removal of the second portions 44 of the photoresist may be performed either simultaneously with or in a separate step from the removal of the third portions of the extrinsic a-Si layer 160 and of the intrinsic a-Si layer 150. Similarly, the removal of the first portions 42 of the photoresist may be performed either simultaneously with or in a separate step from the removal of the second portions of the extrinsic a-Si layer 160. For example, a gas mixture of $SF_6$ and HCl or $SF_6$ and $O_2$ may etch the photoresist and the a-Si layers 150 and 160 with substantially equal etch ratios.

Residue of the photoresist remaining on the surface of the conductive layer 170 may be removed by, e.g., ashing.

In the step (3) of the first example or in the step (4) of the second example, examples of etching gases for etching the intrinsic a-Si layer 150 include a gas mixture of $CF_4$ and HCl and a gas mixture of $CF_4$ and $O_2$. The gas mixture of $CF_4$ and $O_2$ can provide uniform etching thickness of the intrinsic a-Si layer 150.

Referring to FIGS. 8A and 8B, a passivation layer 180 is deposited and a positive photoresist layer 50 is coated. Thereafter, a photo mask 60 is aligned with the substrate 110 and the photoresist layer 50 is exposed to light through the photo mask 60.

The photo mask 60 includes a transparent substrate 61 and an opaque light blocking film 62 and is divided into light transmitting areas TA1 and light blocking areas BA1. The light blocking film 62 has openings on the light transmitting areas TA1. The light blocking film 62 exists as a wide area having width larger than a predetermined value on the light blocking areas BA1. The light transmitting areas TA1 are positioned to correspond with the end portions 179 of the data lines 171 and areas enclosed by the gate lines 121 and the data lines 171. The light blocking areas BA1 are positioned to correspond with the remaining portions. Referring to FIGS. 8A and 8B, hatched portions of the photoresist 50 facing the light transmitting areas TA1 are exposed to light, while portions of the photoresist 50 facing the light blocking areas BA1 are not exposed to light.

The photoresist 50 is developed such that portions 57 of the photoresist 50 that are not exposed to light remain, as shown in FIGS. 9, 10A and 10B. The passivation layer 180 is etched using the remaining portions 57 of the photoresist as an etch mask to form a plurality of openings 187 exposing portions of the wide end portions 177 of the drain electrodes 175 and a plurality of contact holes 182 exposing the end portions 179 of the data lines 171. Subsequently, exposed portions of the gate insulating layer 140 are removed to expose the substrate 110.

Referring to FIGS. 11A and 11B, a conductive film 90 preferably comprising IZO, ITO, or amorphous ITO is deposited by, e.g., sputtering.

The conductive film 90 includes first portions 91 disposed on the photoresist 57 and remaining second portions 92. Since the height difference between the surface and the bottom of the photoresist 57 is large due to the thickness of the photoresist 57, the first portions 91 and the second portions 92 of the conductive film 90 are separated from each other at least in part to form gaps therebetween. These gaps expose at least portions of the lateral sides of the photoresist 57.

The substrate 110 is then dipped into a developer such that the developer infiltrates into the photoresist 57 through the exposed lateral sides of the photoresist 52 to remove the photoresist 57. At this time, the first portions 91 of the conductive film 90 disposed on the photoresist 57 come off along with the photoresist 57, which is referred to as "lift-off." As a result, only the second portions 92 of the conductive film 90 remain to form a plurality of pixel electrodes 190 and a plurality of contact assistants 82 as shown in FIGS. 1, 2A and 2B.

Since the manufacturing method of the TFT array panel according to an embodiment simultaneously forms the data lines 171, the drain electrodes 175, the semiconductors 151, and the ohmic contacts 161 and 165 using a lithography step and omits a lithography step for forming the pixel electrodes 190 and the contact assistants 82, the manufacturing process may be simplified.

Now, a TFT array panel according to another embodiment of the present invention will be described in detail with reference to FIGS. 13, 14A and 14B.

Figure 12:
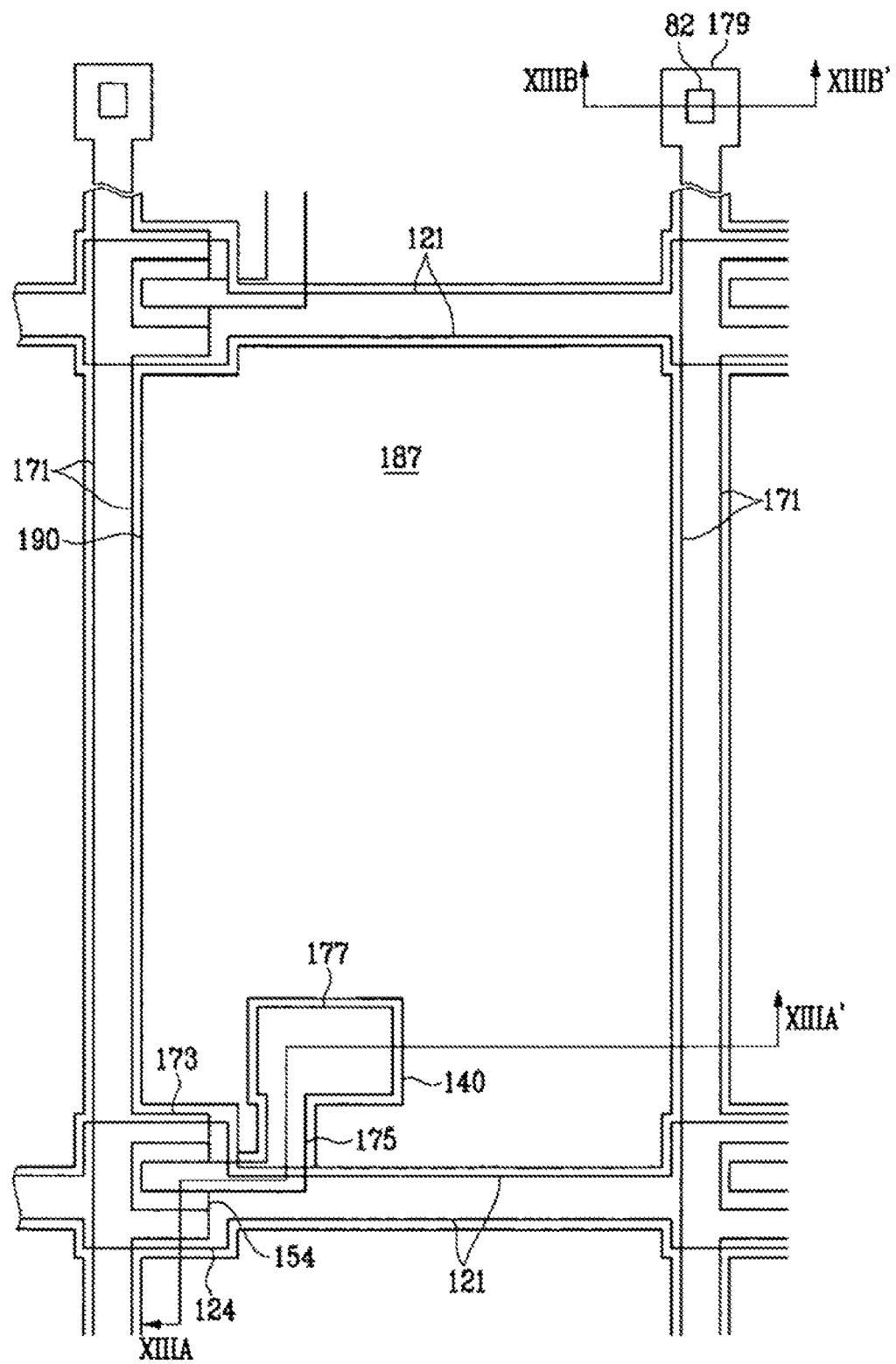
FIG. 12 is a layout view of a TFT array panel according to another embodiment of the present invention.
Figure 13A:
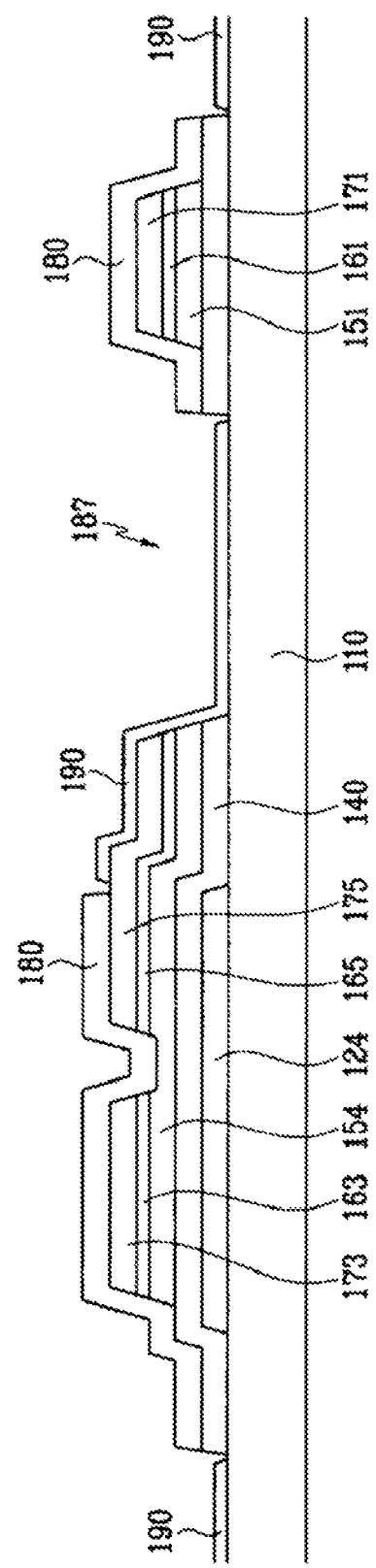
FIG. 13A is a sectional view of the TFT array panel shown in FIG. 12 taken along the line XIIIA-XIIIA'.
Figure 13B:
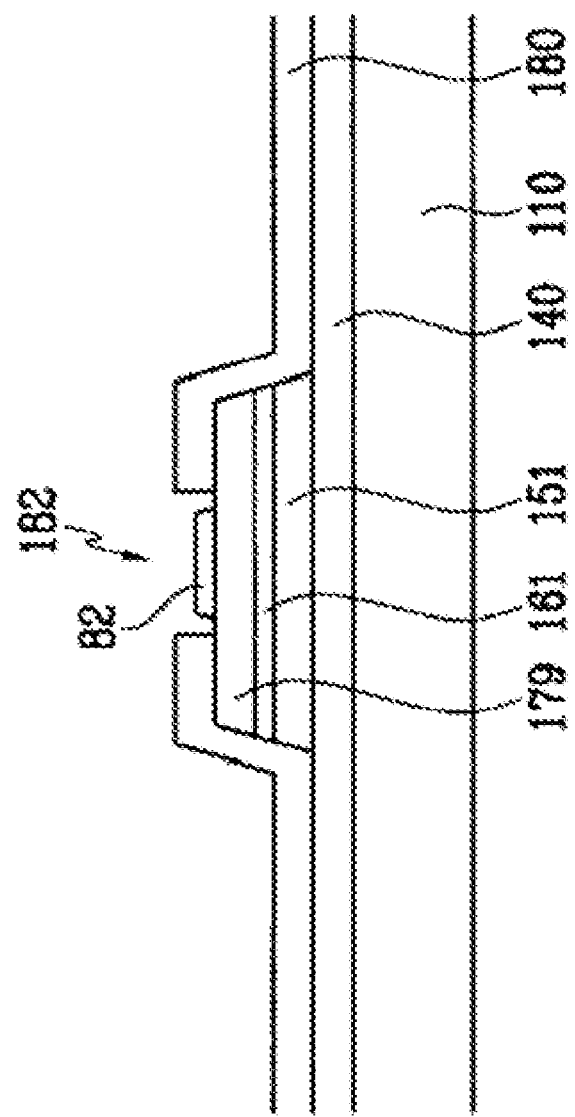
FIG. 13B is a sectional view of the TFT array panel shown in FIG. 12 taken along the line XIIIB-XIIIB'.

FIG. 12 is a layout view of a TFT array panel according to another embodiment of the present invention, FIG. 13A is a sectional view of the TFT array panel shown in FIG. 12 taken along the line XIIIA-XIIIA', and FIG. 13B is a sectional view of the TFT array panel shown in FIG. 12 taken along the line XIIIB-XIIIB'.

A layered structure of the TFT array panel according to this embodiment is similar to that shown in FIGS. 1, 2A and 2B. That is, a plurality of gate lines 121 including gate electrodes 124 are formed on a substrate 110. A gate insulating layer 140, a plurality of semiconductor stripes 151 including projections 154, and a plurality of ohmic contact stripes 161 including projections 163 and a plurality of ohmic contact islands 165 are sequentially formed thereon. A plurality of data lines 171 including source electrodes 173 and end portions 179, and a plurality of drain electrodes 175 including wide end portions 177 are formed on the ohmic contacts 161 and 165. A passivation layer 180 is formed thereon. A plurality of contact holes 182 and a plurality of openings 187 are formed in the passivation layer 180. A plurality of pixel electrodes 190 and a plurality of contact assistants 82 are formed in the openings 187 and the contact holes 182, respectively.

Unlike the TFT array panel shown in FIGS. 1, 2A, and 2B, portions of the gate insulating layer 140 around the drain electrodes 175 in the openings 187 are exposed.

Now, a method of manufacturing the TFT array panel shown in FIGS. 12-13B according to an embodiment of the present invention will be described in detail with reference to FIGS. 14A-18B as well as FIGS. 12-13B.

Figure 14A:
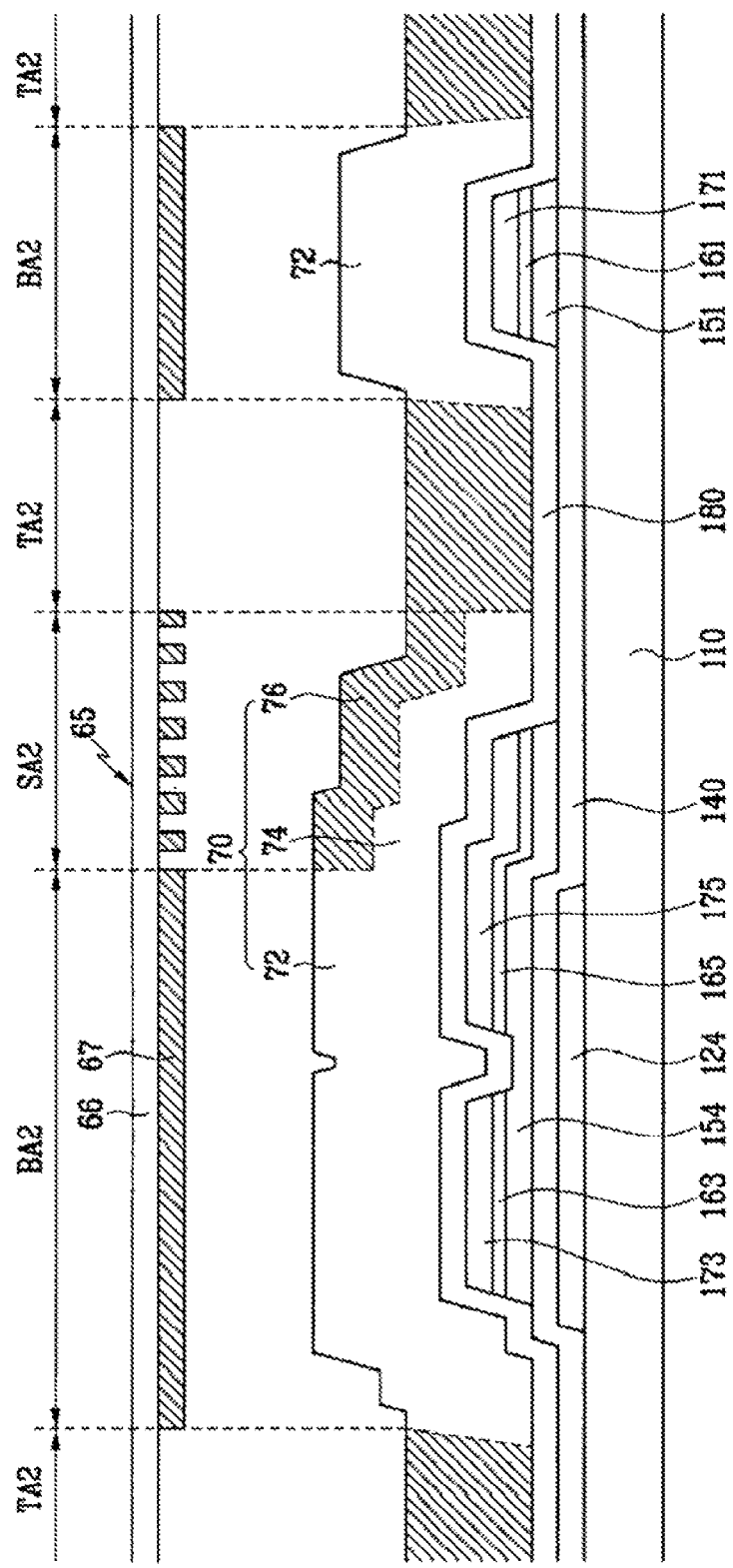
FIGS. 14A and 14B are sectional views of the TFT array panel shown in FIGS. 12-13B taken along the lines XIIIA-XIIIA' and XIIIB-XIIIB', respectively, in intermediate steps of a manufacturing method thereof according to an embodiment of the present invention.
Figure 14B:
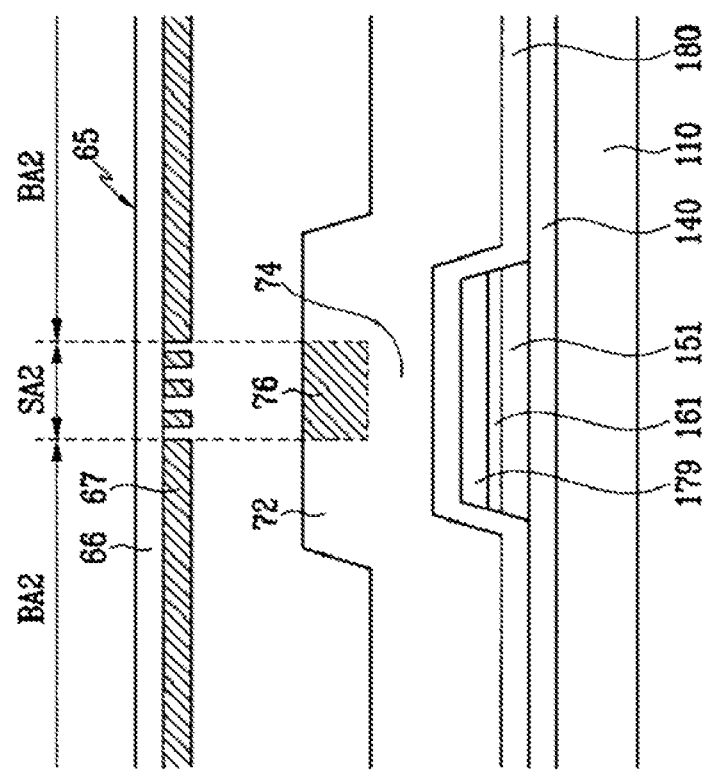
Figure 15B:
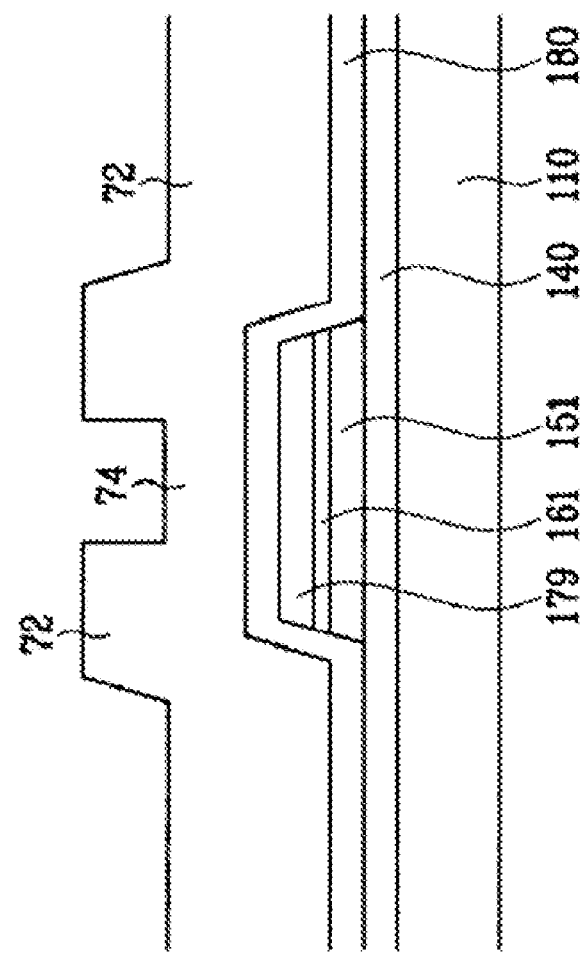
Figure 16A:
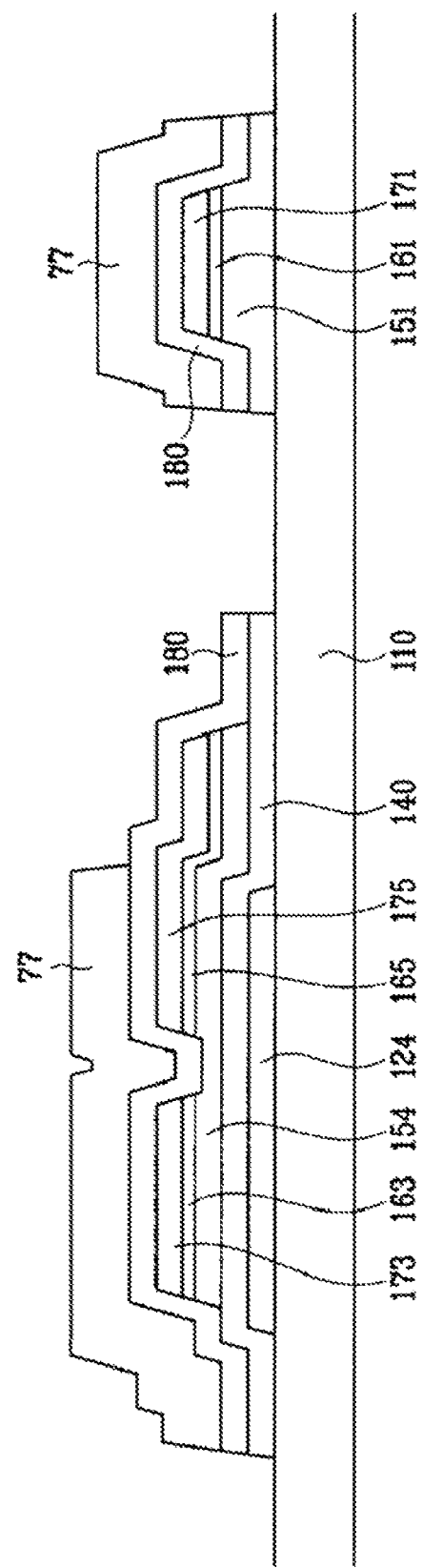
FIGS. 16A and 16B are sectional views of the TFT array panel shown in FIGS. 12-13B taken along the lines XIIIA-XIIIA' and XIIIB-XIIIB', which illustrate the step following the step shown in FIGS. 15A and 15B.
Figure 16B:
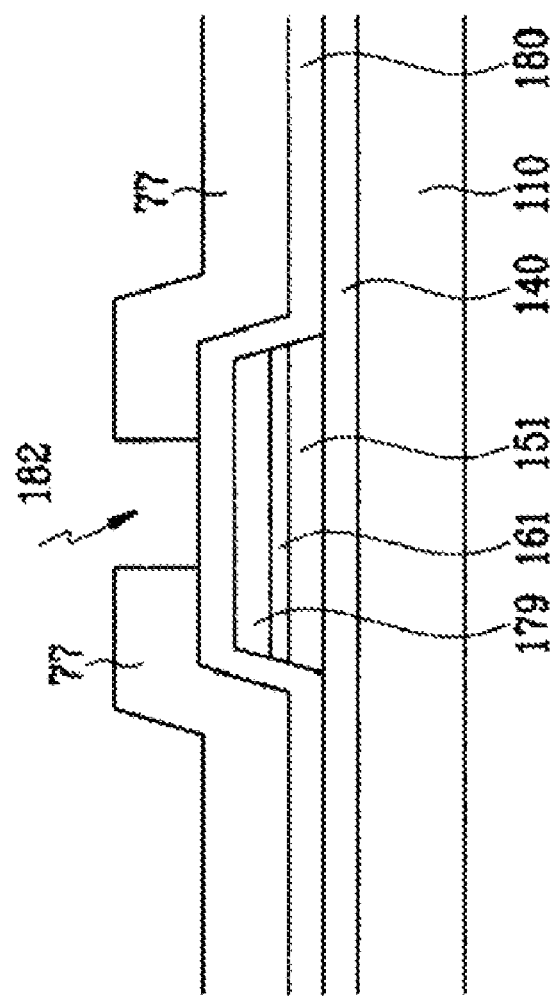
Figure 17A:
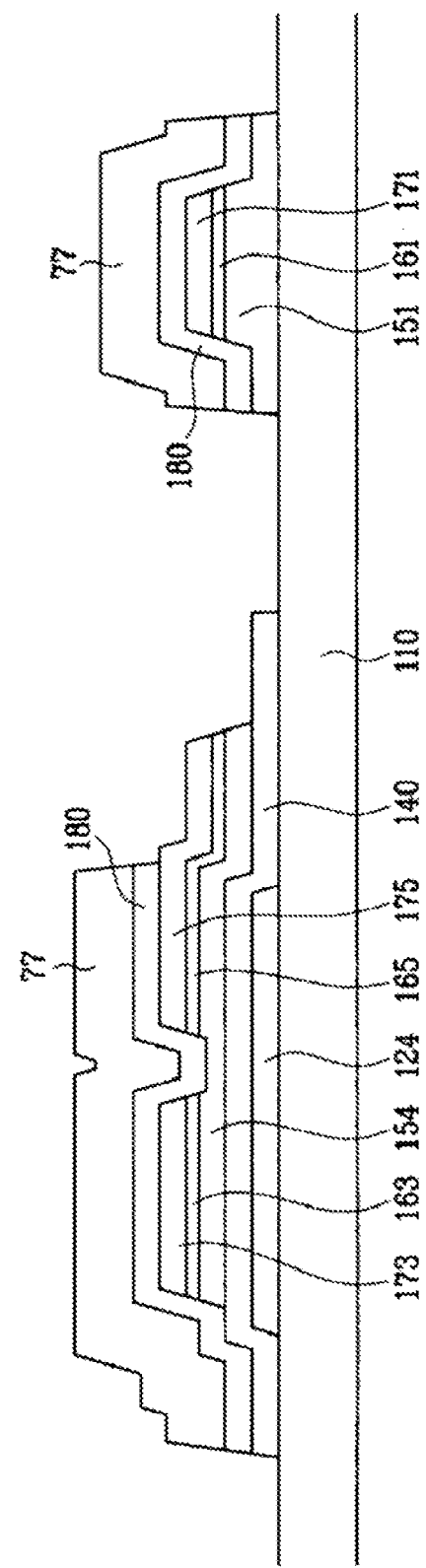
FIGS. 17A and 17B are sectional views of the TFT array panel shown in FIGS. 12-13B taken along the lines XIIIA- XIIIA' and XIIIB-XIIIB', which illustrate the step following the step shown in FIGS. 16A and 16B.
Figure 17B:
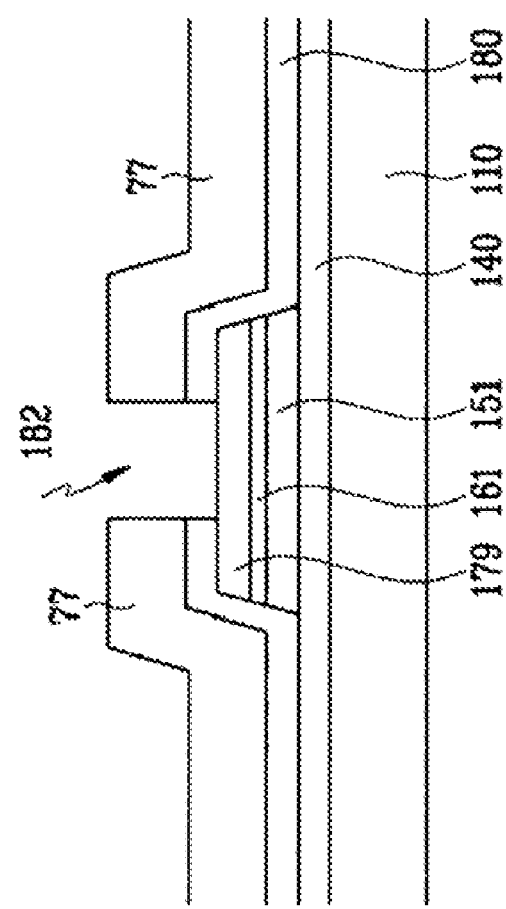

FIGS. 14A and 14B are sectional views of the TFT array panel shown in FIGS. 12-13B taken along the lines XIIIA-XIIIA' and XIIIB-XIIIB', respectively, in intermediate steps of a manufacturing method thereof according to an embodiment of the present invention, FIGS. 15A and 15B are sectional views of the TFT array panel shown in FIGS. 12-13B taken along the lines XIIIA-XIIIA' and XIIIB-XIIIB', which illustrate the step following the step shown in FIGS. 14A and 14B, FIGS. 16A and 16B are sectional views of the TFT array panel shown in FIGS. 12-13B taken along the lines XIIIA-XIIIA' and XIIIB-XIIIB', which illustrate the step following the step shown in FIGS. 15A and 15B, FIGS. 17A and 17B are sectional views of the TFT array panel shown in FIGS. 12-13B taken along the lines XIIIA-XIIIA' and XIIIB-XIIIB', which illustrate the step following the step shown in FIGS. 16A and 16B, and FIGS. 18A and 18B are sectional views of the TFT array panel shown in FIGS. 12-13B taken along the lines XIIIA-XIIIA' and XIIIB-XIIIB', which illustrate the step following the step shown in FIGS. 17A and 17B.

Referring to FIGS. 14A and 14B, a plurality of gate lines 121 including gate electrodes 124, a gate insulating layer 140, a plurality of semiconductor stripes 151 including projections 154, a plurality of ohmic contact stripes 161 including projections 163, a plurality of ohmic contact islands 165, a plurality of data lines 171 including source electrodes 173 and end portions 179, and a plurality of drain electrodes 175 including wide end portions 177 are formed as described with reference to FIGS. 3-7B.

Subsequently, a passivation layer 180 is deposited and a positive photoresist layer 70 is coated thereon. Thereafter, a photo mask 65 is aligned with the substrate 110.

The photo mask 65 includes a transparent substrate 66 and an opaque light blocking film 67 and is divided into light transmitting areas TA2, light blocking areas BA2, and translucent areas SA. The light blocking film 67 has openings on the light transmitting areas TA2 and slits on the translucent areas SA. The openings and the slits are defined by the width thereof relative to a predetermined value. Those having a width larger than the predetermined value are referred to as openings, while those having a width smaller than the predetermined value are referred to as slits. The translucent areas SA are positioned to correspond with the end portions 179 of the data lines 171 and portions of the drain electrodes 175 including the wide end portions 177 and the peripheral areas therearound. The light transmitting areas TA2 are positioned to correspond with the areas enclosed by the gate lines 121 and the data lines 171 except for the portions corresponding to the translucent areas SA. The light blocking areas BA2 correspond to the remaining portions.

The photoresist layer 70 is exposed to light through the photo mask 65 and is developed such that first portions 72 and second portions 74 thinner than the first portions 72 remain, as shown in FIGS. 15A and 15B. In FIGS. 14A and 14B, the hatched portions of the photoresist layer 70 indicate the portions to be removed after development. Reference numeral 76 indicates the portions to be removed after development among the portions facing the translucent areas SA.

Referring to FIGS. 15A and 15B, the passivation layer 180 and the gate insulating layer 140 are etched using the remaining portions 72 and 74 of the photoresist layer 70 as an etch mask, thereby exposing the substrate 110.

Referring to FIGS. 16A and 16B, the thin portions 74 of the photoresist layer 70 are removed by, e.g., ashing, and the thickness of the thick portions 52 is decreased to form a photoresist portion 77.

Referring to FIGS. 17A and 17B, the passivation layer 180 is etched using the photoresist portion 77 as an etch mask to form a plurality of openings exposing portions of the drain electrodes 175, portions of the gate insulating layer 140 disposed around the drain electrodes 175, and a plurality of contact holes 182 exposing the end portions 179 of the data lines 179.

Figure 18A:
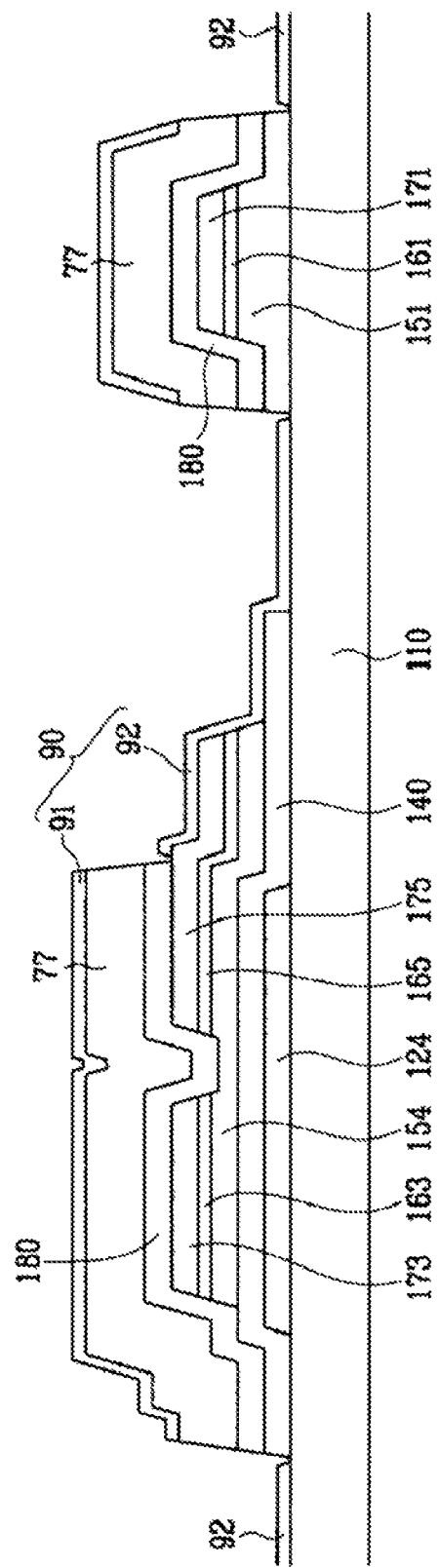
FIGS. 18A and 18B are sectional views of the TFT array panel shown in FIGS. 12-13B taken along the lines XIIIA-XIIIA' and XIIIB-XIIIB', which illustrate the step following the step shown in FIGS. 17A and 17B.
Figure 18B:
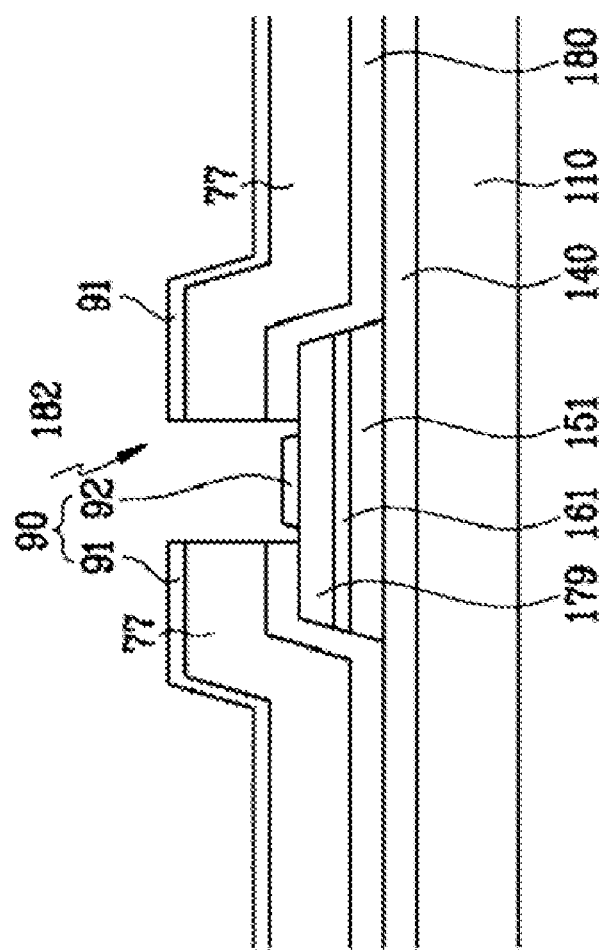

Referring to FIGS. 18A and 18B, a conductive film 90 preferably comprising IZO, ITO, or amorphous ITO is deposited by sputtering, etc. The conductive film 90 includes first portions 91 disposed on the photoresist 77 and remaining second portions 92. The photoresist 77 and the first portions 91 of the conductive film 90 thereon are removed by lift off to form a plurality of pixel electrodes 190 and a plurality of contact assistants 82 as shown in FIGS. 12, 13A, and 13B.

The gate insulating layer 140 is exposed near the drain electrodes 175. Therefore, the upper surface of the gate insulating layer 140 provides an intermediate transition surface between the upper surface of the drain electrodes 175 to the upper surface of the substrate 110. Thus, the disconnection of the pixel electrode layer 190 from the edge of the drain electrodes 175 can be avoided.

Since the manufacturing method of the TFT array panel according to this embodiment also simultaneously forms the data lines 171, the drain electrodes 175, the semiconductors 151, and the ohmic contacts 161 and 165 using a single lithography step and omits a separate lithography step for forming the pixel electrodes 190 and the contact assistants 82, the manufacturing process may be simplified.

Many of the above-described features of the TFT array panel and the manufacturing method thereof shown in FIGS. 1-11B may also apply to the TFT array panel and the manufacturing method thereof shown in FIGS. 12-18B.

Now, a TFT array panel according to another embodiment of the present invention will be described in detail with reference to FIGS. 19 and 20.

Figure 19:
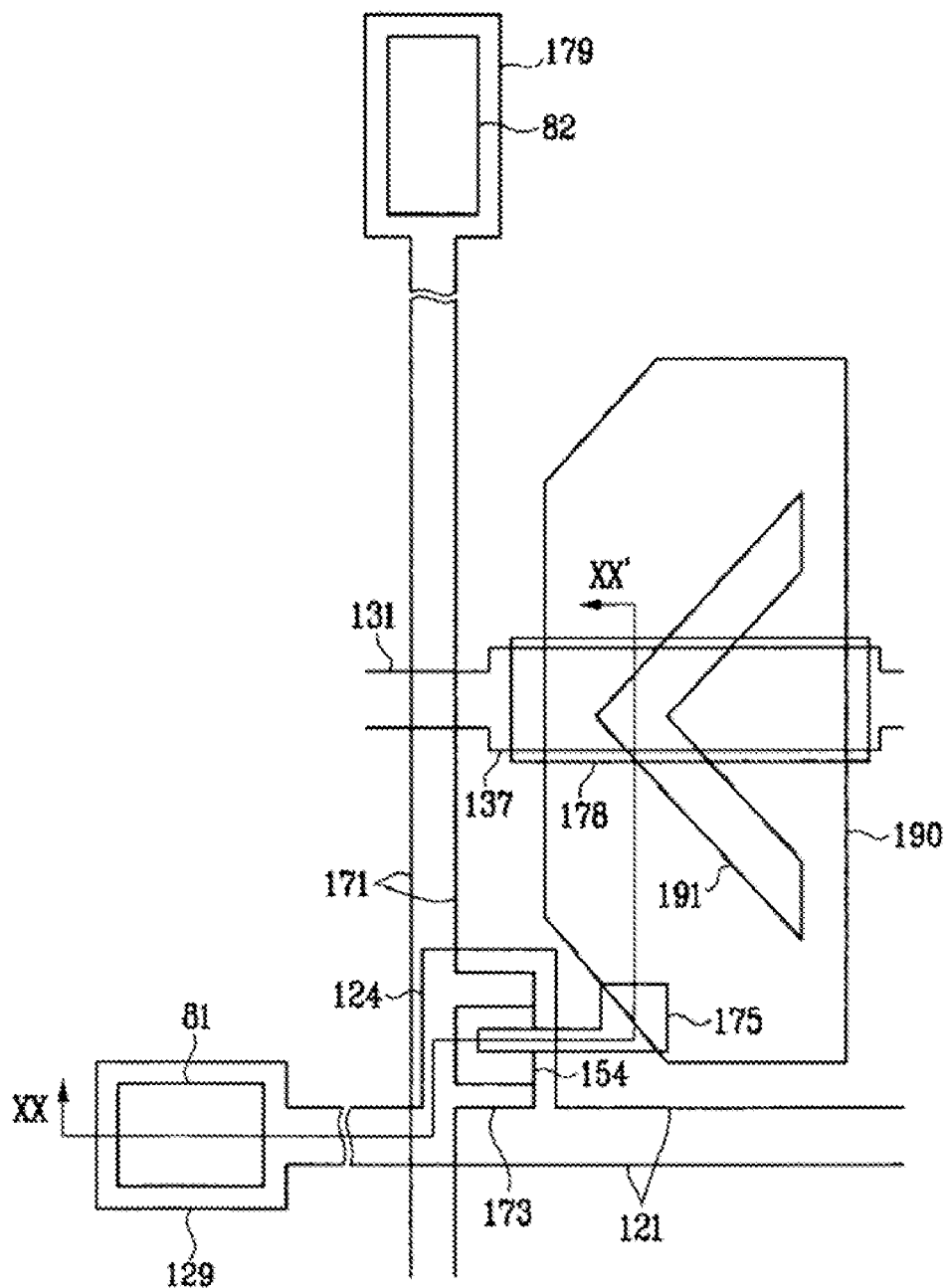
FIG. 19 is a layout view of a TFT array panel according to another embodiment of the present invention.

FIG. 19 is a layout view of a TFT array panel according to another embodiment of the present invention. FIG. 20 is a sectional view of the TFT array panel shown in FIG. 19 taken along the line XX-XX'.

A layered structure of the TFT array panel according to this embodiment is similar to that shown in FIGS. 1, 2A, and 2B. That is, a plurality of gate lines 121 including gate electrodes 124 are formed on a substrate 110. A gate insulating layer 140, a plurality of semiconductor stripes 151 including projections 154, and a plurality of ohmic contact stripes 161 including projections 163 and a plurality of ohmic contact islands 165 are sequentially formed thereon. A plurality of data lines 171 including source electrodes 173 and end portions 179, and a plurality of drain electrodes 175 are formed on the ohmic contacts 161 and 165. A passivation layer 180 is formed thereon. A plurality of contact holes 182 and a plurality of openings 187 are formed in the passivation layer 180. A plurality of pixel electrodes 190 and a plurality of contact assistants 82 are formed in the openings 187 and the contact holes 182, respectively.

Unlike the TFT array panel shown in FIGS. 1, 2A, and 2B, each pixel electrode 190 has a cutout 191 and the passivation layer 180 includes portions disposed in the cutout 191.

In addition, the TFT array panel according to this embodiment further includes a plurality of storage electrode lines 131 disposed on the same layer as the gate lines 121. The storage electrode lines 131 extend substantially parallel to the gate lines 121 and are supplied with a predetermined voltage such as a common voltage, which is applied to a common electrode (not shown) on a common electrode panel (not shown). Each storage electrode line 131 includes a plurality of expansions 137 which extend laterally across the surface of the substrate 110 (projecting upward and downward, as shown in the perspective illustrated in FIG. 19) and overlapping the pixel electrodes 190.

A plurality of storage conductors 178 are formed on the gate insulating layer 140. The storage conductors 178 contact the pixel electrodes 190 and overlap the expansions 137 of the storage electrodes lines 131 such that the storage conductors 178 cover the full width of the expansions 137. A plurality of semiconductor islands 157 and a plurality of ohmic contact islands 167 are sequentially formed under the storage conductors 178 and have substantially the same planar shape as the storage conductors 178.

The storage electrode lines 131 and the storage conductors 178 connected to the pixel electrodes 190 form storage capacitors for enhancing the charge storing capacity of liquid crystal capacitors formed by the pixel electrodes 190 and the common electrode.

Furthermore, each gate line 121 includes an end portion 129 having a large area for contact with another layer or an external driving circuit. The passivation layer 180 and the gate insulating layer 140 have a plurality of contact holes 181 exposing the end portions 129 of the gate lines 121, and a plurality of contact assistants 81 are formed in the contact holes 181.

Figure 20:
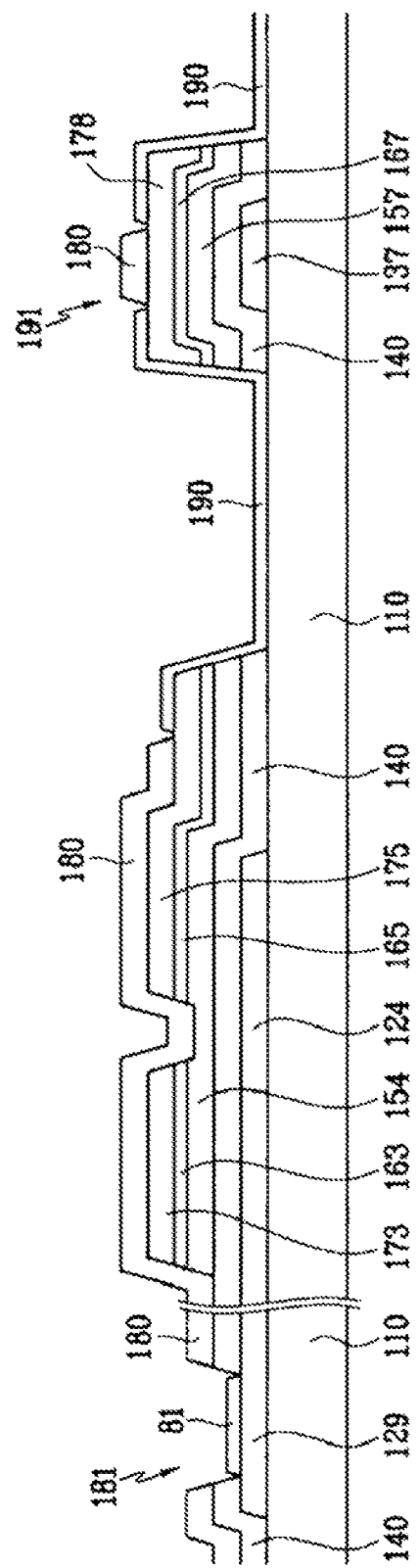
FIG. 20 is a sectional view of the TFT array panel shown in FIG. 19 taken along the line XX-XX'.

A method of manufacturing the TFT array panel shown in FIGS. 19 and 20 is similar to that shown in FIGS. 1-11B. However, the method is different in that the storage electrode lines 131 are formed along with the gate lines 121. In addition, the storage conductors 178, the semiconductor islands 157, and the ohmic contact islands 167 are formed along with the data lines 171, the drain electrodes 175, the semiconductors stripes 151, and the ohmic contacts 161 and 165. The contact holes 181 on the end portions 129 of the gate lines 121 are formed along with the contact holes 182 and the openings 187, and the contact assistants 81 are formed along with the pixel electrodes 190 and the contact assistants 82.

Many of the above-described features of the TFT array panel and the manufacturing method thereof shown in FIGS. 1-11B may also apply to the TFT array panel shown in FIGS. 19 and 20 and the manufacturing method thereof.

As described above, the pixel electrodes and the contact holes connecting the drain electrodes and the pixel electrodes are formed using a single lithography step. Accordingly, a separate lithography step for forming the pixel electrodes may be omitted to simplify the manufacturing process, thereby reducing the manufacturing time and the cost.

The present invention can be employed to any display devices, including, e.g., LCD and OLED displays. Each pixel of the OLED display includes at least two thin film transistors including a first thin film transistor connected to gate lines and data lines and a second thin film transistor connected to pixel electrodes. Each pixel also includes an organic light emitting layer disposed between the pixel electrode and common electrode.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A thin film transistor array panel comprising:
a gate line formed on a substrate;
a gate insulating layer formed on the gate line;
a semiconductor layer formed on the gate insulating layer;
a data line and a drain electrode formed on the semiconductor layer, the drain electrode including first and second portions;
a passivation layer formed on the data line and the first portion of the drain electrode; and
a pixel electrode formed on the substrate and the second portion of the drain electrode, said pixel electrode having edges substantially coinciding with edges of the passivation layer;
wherein the gate insulating layer has edges substantially coinciding with edges of the passivation layer except for a portion around the drain electrode,
an upper surface of the portion of the gate insulating layer around the drain electrode is exposed, and
the exposed upper surface of the gate insulating layer is covered with the pixel electrode.

2. The thin film transistor array panel of claim 1, wherein:
the passivation layer has a contact hole exposing a portion of the data line; and
the thin film transistor array panel further comprises a contact assistant formed in the contact hole and having edges substantially coinciding with edges of the contact hole.

3. The thin film transistor array panel of claim 1, wherein the gate insulating layer has edges substantially coinciding with edges of the passivation layer except for a portion under the drain electrode.

4. The thin film transistor array panel of claim 1, wherein the semiconductor layer has substantially the same planar shape as the data line and the drain electrode except for a portion disposed between the data line and the drain electrode.

5. The thin film transistor array panel of claim 1, wherein the pixel electrode includes a cutout.

6. The thin film transistor array panel of claim 5, further comprising a storage electrode comprised of the same layer as the gate line and overlapping the pixel electrode.

7. The thin film transistor array panel of claim 6, further comprising a storage conductor formed on the gate insulating layer, connected to the pixel electrode, and overlapping the storage electrode.

* * * * *